(12) United States Patent
Schell

(10) Patent No.: US 12,407,488 B2
(45) Date of Patent: Sep. 2, 2025

(54) QUADRATURE DIVIDER ERROR CORRECTION

(71) Applicant: Avago Technologies International Sales Pte. Limited, Singapore (SG)

(72) Inventor: Robert C. Schell, Chatham, NJ (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 132 days.

(21) Appl. No.: 18/308,460

(22) Filed: Apr. 27, 2023

(65) Prior Publication Data

US 2024/0364494 A1 Oct. 31, 2024

(51) Int. Cl.
*H04L 7/00* (2006.01)
*H03L 7/093* (2006.01)
*H03L 7/099* (2006.01)

(52) U.S. Cl.
CPC ............ *H04L 7/0025* (2013.01); *H03L 7/093* (2013.01); *H03L 7/0992* (2013.01)

(58) Field of Classification Search
CPC ...... H03L 7/093; H03L 7/0992; H04L 7/0025
USPC .......................................................... 375/376
See application file for complete search history.

(56) References Cited

U.S. PATENT DOCUMENTS

| 2005/0001665 A1* | 1/2005 | Lin ......................... H03K 5/133 327/238 |
| 2018/0083763 A1* | 3/2018 | Black ........................ H03L 7/22 |

* cited by examiner

*Primary Examiner* — Leila Malek
(74) *Attorney, Agent, or Firm* — Foley & Lardner LLP

(57) ABSTRACT

A circuit including a frequency divider configured to receive a plurality of first frequency input clock signals and provide a plurality of second frequency output clock signals, wherein the plurality of second frequency output clock signals are lower in frequency than the plurality of first frequency input clock signals, a phase detector configured to determine a difference between the plurality of second frequency output clock signals, a low pass filter configured to measure a clock signal spacing error associated with the plurality of second frequency output clock signals based on the difference between the plurality of second frequency output clock signals and to generate one or more control signals in response to the clock signal spacing error, and a control unit configured to generate one or more corrected first frequency input clock signals based on the one or more control signals.

17 Claims, 22 Drawing Sheets

QUADRATURE DIVIDER ERROR CORRECTION

FIELD OF THE DISCLOSURE

This disclosure generally relates to systems for and methods of frequency division, including but not limited to systems and methods for providing clock signals at different frequencies and synchronizing multiple frequency clock dividers.

BACKGROUND OF THE DISCLOSURE

In the last few decades, the market for electronic devices has grown by orders of magnitude, fueled by the use of portable devices, and increased connectivity, data transfer, and data storage in all manners of devices. Many modern electronic devices rely upon clock signals. A clock signal may be defined as a signal that oscillates between a high and low state at a constant frequency and is used to synchronize the actions of one or more electric circuits and devices in some embodiments. For example, systems on a chip (SoCs) often use several clocks domains with different programmable frequencies to realize a wide range of functionalities and cover different modes of operation.

BRIEF DESCRIPTION OF THE DRAWINGS

Various objects, aspects, features, and advantages of the disclosure will become more apparent and better understood by referring to the detailed description taken in conjunction with the accompanying drawings, in which like reference characters identify corresponding elements throughout. In the drawings, like reference numbers generally indicate identical, functionally similar, and/or structurally similar elements.

Figure 1A:
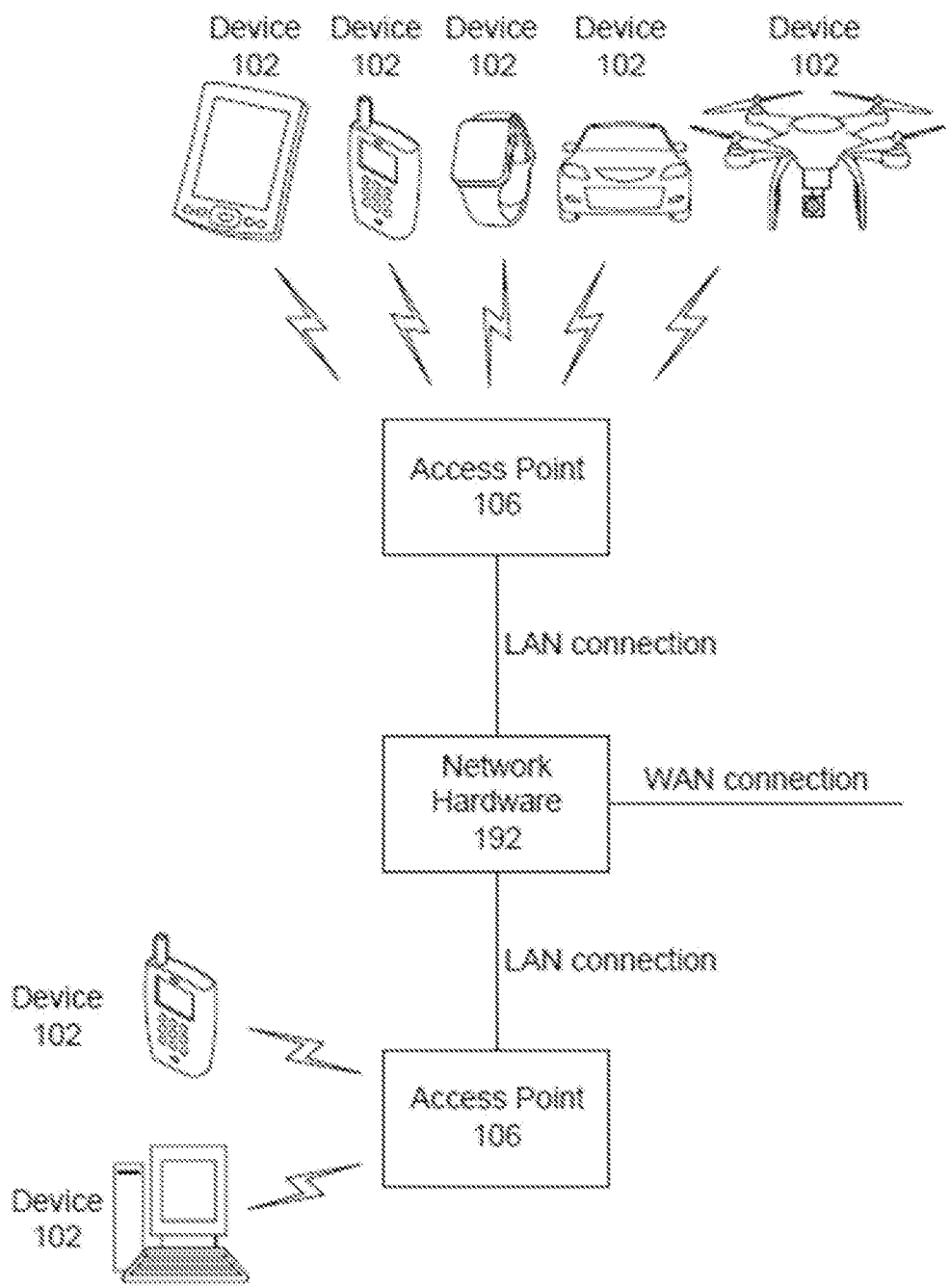
FIG. 1A is a block diagram depicting an embodiment of a computing environment including one or more access points in communication with one or more wireless devices or stations.

The details of various embodiments of the methods and systems are set forth in the accompanying drawings and the description below.

DETAILED DESCRIPTION

The following IEEE standard(s), including any draft versions of such standard(s), are hereby incorporated herein by reference in their entirety and are made part of the present disclosure for all purposes IEEE 802.3, IEEE 802.11x, IEEE 802.11ad, IEEE 802.11ah, IEEE 802.11aj, IEEE 802.16 and 802.16a, and IEEE 802.11ac. In addition, although this disclosure may reference aspects of these standard(s), the disclosure is in no way limited by these standard(s).

For purposes of reading the description of the various embodiments below, the following descriptions of the sections of the specification and their respective contents may be helpful. Section A describes a network environment and computing environment which may use frequency division according to some embodiments described herein, and Sections B-D describe embodiments of systems for and method of frequency division. Although this disclosure can reference aspects of various standard(s) and specification(s), the disclosure is in no way limited to these aspects.

In some embodiments, systems and methods provide clock domains for integrated circuits (e.g., SoCs). The systems and methods can reduce area and power consumption overhead associated with phase locked loop (PLL) cores that are used to generate the clock signals. In some embodiments, systems and methods meet frequency resolution, range, and low-jitter requirements that are very difficult to realize using conventional PLL cores. In some embodiments, a fractional divider is provided in silicon products, application specific circuits (ASIC), digital signal processors, programmable logic circuits, SoCs, or standard products that need highly programmable, low-jitter clock generators. In some embodiments, a fractional divider provides very fine ratio-based frequency resolution, uses small silicon area, provides low-jitter performance, provides unlimited frequency modulation capability, and is scalable and portable to newer integrated circuit processes. In some embodiments, systems and methods of fractional frequency division are used in modern high-speed and power-efficient data communication and processing systems, including but not limited to any backplane, serializer/deserializer (SERDES), Ethernet physical layer (PHY), optical transceiver, digital signal processor (DSP) module in coherent transceivers, input/output (I/O) interfaces, multicore processors, memories, power management, and wireless transceivers.

Some embodiments relate to a frequency divider for providing a lower frequency clock output based on a higher frequency clock input. In some embodiments, the frequency divider may produce output clock signals with clock signal spacing error. The systems and methods described herein provide a technique for correcting the clock signal spacing error.

Further, some embodiments relate to synchronizing sub-rate clocks which may be used in communication systems. In many analog to digital converters (ADCs), deserializer circuits in link communication (SERDES), or even radio receivers (RF radios), the information is processed synchronously with a clock. As the data rates have increased to well above 20 Gb/s, it is generally preferred to process the data with multiple sub-rate clocks. For example, in one embodiment, a data rate of 20 Gb/s can be captured with two 10 GHz clocks, or four 5 GHz clocks, etc. When using such sub-rate clocks in communication systems with a certain data rate (e.g., 20 Gb/s), it may be desired that the multiple sub-rate clocks are as equally spaced in time as possible so that the timing reference is equal to the full data rate itself. For example, in the case of a 20 Gb/s system, the timing reference would be at 20 GHz, or a period of 50 ps. In such a case, the data rate may be implemented with a sub-rate system with four 5 GHz clocks, where ideally the four clocks' rising edges (timing references) are spaced by exactly 50 ps. A rising edge may refer to when a clock signal moves from a low state (e.g., 0) to a high state (e.g., 1) in some embodiments. To ensure this, the sub-rate clocks may be synchronized when dividing the frequency to create the sub-rate clocks. A sub-rate clock signal may refer to an output signal of a frequency divider which is at a lower frequency than the input to the frequency divider in some embodiments. The systems and methods described herein provide a technique for providing such a synchronization.

A. Computing and Network Environment

Prior to discussing specific embodiments of the present solution, it may be helpful to describe aspects of the operating environment as well as associated system components (e.g., hardware elements) in connection with the methods and systems described herein. Referring to FIG. 1A, an embodiment of a network environment is depicted. The network may include or be in communication with one or more storage area networks (SANs), security adapters, or Ethernet converged network adapters (CNAs). In brief overview, the network environment includes a wireless communication system that includes one or more access points 106, one or more wireless communication devices 102 and a network hardware component 192. The wireless communication devices 102 may for example include laptop computers 102, tablets 102, personal computers 102, wearable devices 102, vehicles 102 (e.g., automobiles, drones, smart vehicles, robotic units, etc.), smart televisions 102, gaming consoles 102, internet of things (IoT) devices 102, cellular telephone devices 102, and/or any other electronic devices capable of wireless communication. The details of an embodiment of wireless communication devices 102 and/or access point 106 are described in greater detail with reference to FIGS. 1B and 1C. The network environment can be an ad hoc network environment, an infrastructure wireless network environment, a wired network coupled to a wireless network, a subnet environment, etc., or a combination of the foregoing, in one embodiment.

The access points (APs) 106 may be operably coupled to the network hardware 192 via local area network connections. The network hardware 192, which may include one or more routers, gateways, switches, bridges, modems, system controllers, appliances, etc., may provide a local area network connection for the communication system. Each of the access points 106 may have an associated antenna or an antenna array to communicate with the wireless communication devices 102 in its area. The wireless communication devices 102 may register with a particular access point 106 to receive services from the communication system (e.g., via a SU-MIMO or MU-MIMO configuration). For direct connections (i.e., point-to-point communications), some wireless communication devices 102 may communicate directly via an allocated channel and communications protocol. Some of the wireless communication devices 102 may be mobile or relatively static with respect to the access point 106.

In some embodiments, an access point 106 includes a device or module (including a combination of hardware and software) that allows wireless communication devices 102 to connect to a wired network using Wi-Fi or other standards. An access point 106 may sometimes be referred to as a wireless access point (WAP). An access point 106 may be configured, designed and/or built for operating in a wireless local area network (WLAN). An access point 106 may connect to a router (e.g., via a wired network) as a stand-alone device in some embodiments. In other embodiments, an access point 106 can be a component of a router. An access point 106 can provide multiple devices access to a network. An access point 106 may, for example, connect to a wired Ethernet connection and provide wireless connections using radio frequency links for other wireless communication devices 102 to utilize that wired connection. An access point 106 may be built and/or configured to support a standard for sending and receiving data using one or more radio frequencies. Those standards and the frequencies they use may be defined by the IEEE (e.g., IEEE 802.11 standards). An access point 106 may be configured and/or used to support public internet hotspots, and/or on an internal network to extend the network's Wi-Fi signal range.

In some embodiments, the access points 106 may be used for in-home or in-building wireless networks (e.g., IEEE 802.11, Bluetooth, ZigBee, or any other type of radio frequency based network protocol and/or variations thereof). Each of the wireless communication devices 102 may include a built-in radio and/or is coupled to a radio. Such wireless communication devices 102 and/or access points 106 may operate in accordance with the various aspects of the disclosure as presented herein to enhance performance, reduce costs and/or size, and/or enhance broadband applications. Each wireless communication device 102 may have the capacity to function as a client node seeking access to resources (e.g., data, and connection to networked nodes such as servers) via one or more access points.

The network connections may include any type and/or form of network and may include any of the following: a point-to-point network, a broadcast network, a telecommunications network, a data communication network, or a computer network. The topology of the network may be a bus, star, or ring network topology. The network may be of any such network topology as known to those ordinarily skilled in the art capable of supporting the operations described herein. In some embodiments, different types of data may be transmitted via different protocols. In other embodiments, the same types of data may be transmitted via different protocols.

Figure 1B:
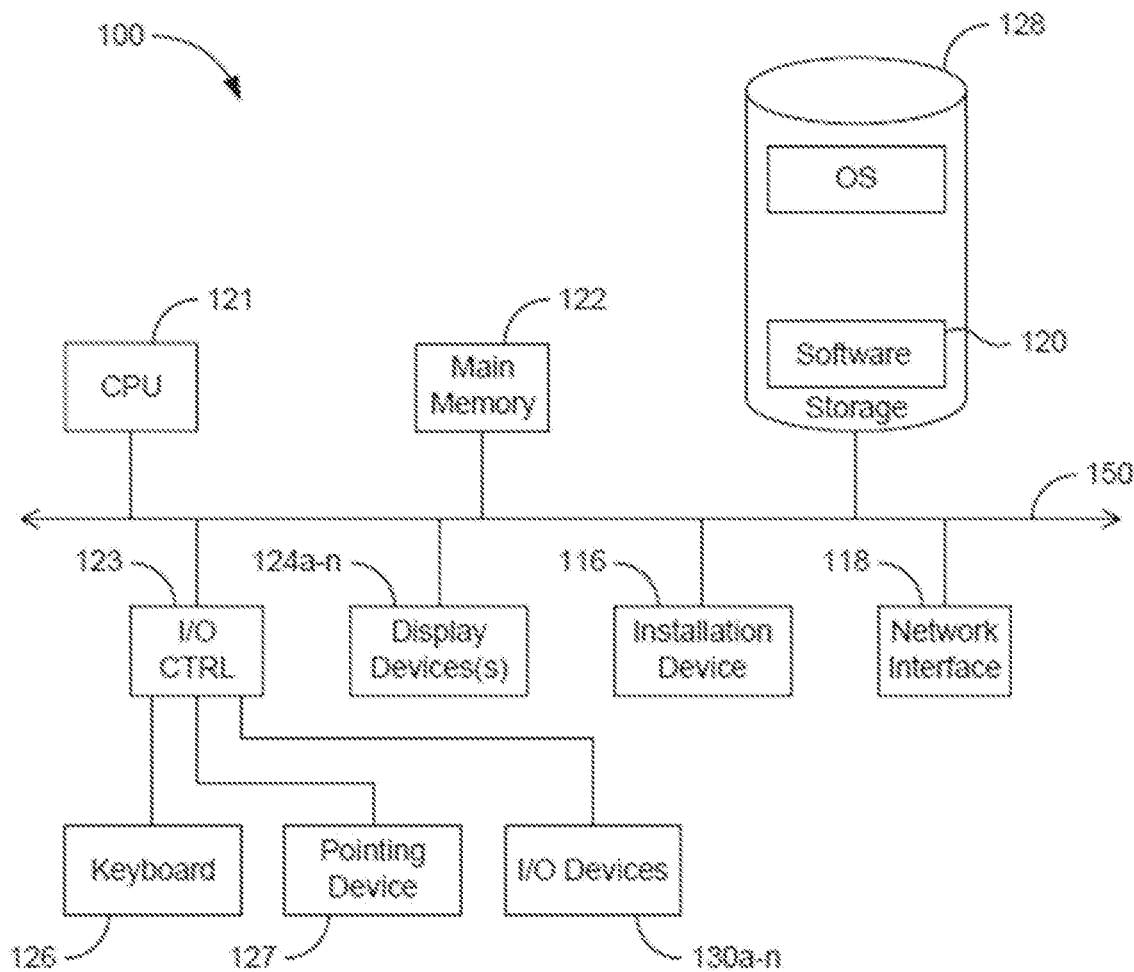
FIGS. 1B and 1C are block diagrams depicting embodiments of computing devices useful in connection with the methods and systems described herein.
Figure 1C:
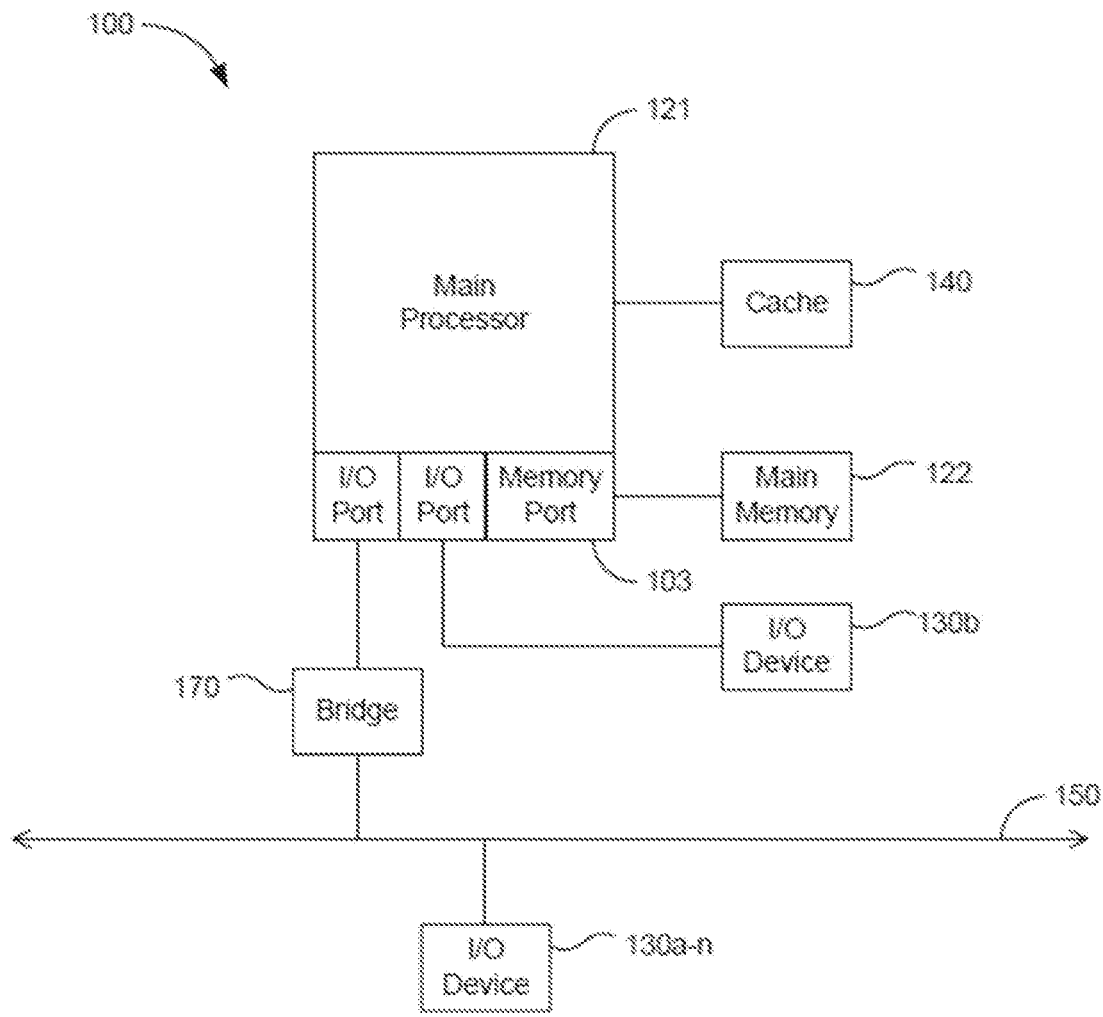

The communications device(s) 102 and access point(s) 106 may be deployed as and/or executed on any type and form of computing device, such as a computer, network device, or appliance capable of communicating on any type and form of network and performing the operations described herein. FIGS. 1B and 1C depict block diagrams of a computing device 100 useful for practicing an embodiment of the wireless communication device 102 or access point 106. As shown in FIGS. 1B and 1C, each computing device 100 includes a central processing unit 121 and a main memory unit 122. As shown in FIG. 1B, a computing device 100 may include a storage device 128, an installation device 116, a network interface 118, an I/O controller 123, display devices 124a-101n, a keyboard 126 and a pointing device 127, such as a mouse. The storage device 128 may include, without limitation, an operating system and/or software. As shown in FIG. 1C, each computing device 100 may also include additional optional elements, such as a memory port 103, a bridge 170, one or more input/output devices 130a-130n (generally referred to using reference numeral 130), and a cache memory 140 in communication with the central processing unit 121.

The central processing unit 121 is any logic circuitry that responds to and processes instructions fetched from the main memory unit 122. In many embodiments, the central processing unit 121 is provided by a microprocessor unit, such as: those manufactured by Intel Corporation of Mountain View, California; those manufactured by International Business Machines of White Plains, New York; or those manufactured by Advanced Micro Devices of Sunnyvale, California. The computing device 100 may be based on any of these processors, or any other processor capable of operating as described herein.

Main memory unit 122 may be one or more memory chips capable of storing data and allowing any storage location to be accessed by the central processing unit 121, such as any type or variant of Static random access memory (SRAM), Dynamic random access memory (DRAM), Ferroelectric RAM (FRAM), NAND Flash, or NOR Flash and Solid State Drives (SSD). The main memory 122 may be based on any of the above described memory chips, or any other available memory chips capable of operating as described herein. In the embodiment shown in FIG. 1B, the central processing unit 121 communicates with main memory 122 via a system bus 150 (described in more detail below). FIG. 1C depicts an embodiment of a computing device 100 in which the central processing unit 121 communicates directly with main memory 122 via a memory port 103. For example, in FIG. 1C the main memory 122 may be DRAM.

FIG. 1C depicts an embodiment in which the central processing unit 121 communicates directly with cache memory 140 via a secondary bus, sometimes referred to as a backside bus. In other embodiments, the central processing unit 121 communicates with cache memory 140 using the system bus 150. Cache memory 140 typically has a faster response time than main memory 122 and is provided by, for example, SRAM, BSRAM, or EDRAM. In the embodiment shown in FIG. 1C, the central processing unit 121 communicates with various I/O devices 130 via a local system bus 150. Various buses may be used to connect the central processing unit 121 to any of the I/O devices 130, for example, a VESA VL bus, an ISA bus, an EISA bus, a MicroChannel Architecture (MCA) bus, a PCI bus, a PCI-X bus, a PCI-Express bus, or a NuBus. For embodiments in which the I/O device is a video display 124, the central processing unit 121 may use an Advanced Graphics Port (AGP) to communicate with the video display 124. FIG. 1C depicts an embodiment of a computer or computing device 100 in which the central processing unit 121 may communicate directly with I/O device 130b, for example via HYPERTRANSPORT, RAPIDIO, or INFINIBAND communications technology. FIG. 1C also depicts an embodiment in which local busses and direct communication are mixed: the central processing unit 121 communicates with I/O device 130a using a local interconnected bus while communicating with I/O device 130b directly.

A wide variety of I/O devices 130a-130n may be present in the computing device 100. Input devices include keyboards, mice, trackpads, trackballs, microphones, dials, touch pads, touch screens, and drawing tablets. Output devices include video displays, speakers, inkjet printers, laser printers, projectors and dye-sublimation printers. The I/O devices 130a-130n may be controlled by an I/O controller 123 as shown in FIG. 1B. The I/O controller 123 may control one or more I/O devices 130a-130n such as a keyboard 126 and a pointing device 127, e.g., a mouse or optical pen. Furthermore, an I/O device 130a-130n may also provide storage and/or an installation medium 116 for the computing device 100. In other embodiments, the computing device 100 may provide USB connections (not shown) to receive handheld USB storage devices such as the USB Flash Drive line of devices manufactured by Twintech Industry, Inc. of Los Alamitos, California.

Referring again to FIG. 1B, the computing device 100 may support any suitable installation device 116, such as a disk drive, a CD-ROM drive, a CD-R/RW drive, a DVD-ROM drive, a flash memory drive, tape drives of various formats, USB device, hard-drive, a network interface, or any other device suitable for installing software and programs. The computing device 100 may further include a storage device, such as one or more hard disk drives or redundant arrays of independent disks, for storing an operating system and other related software, and for storing application software programs such as any program or software 120 for implementing (e.g., software 120 configured and/or designed for) the systems and methods described herein. Optionally, any of the installation devices 116 could also be used as the storage device. Additionally, the operating system and the software 120 can be run from a bootable medium.

Furthermore, the computing device 100 may include a network interface 118 to interface to the network 104 through a variety of connections including, but not limited to, standard telephone lines, LAN or WAN links (e.g., 802.11, T1, T3, 56 kb, X.25, SNA, DECNET), broadband connections (e.g., ISDN, Frame Relay, ATM, Gigabit Ethernet, Ethernet-over-SONET), wireless connections, or some combination of any or all of the above. Connections can be established using a variety of communication protocols (e.g., TCP/IP, IPX, SPX, NetBIOS, Ethernet, ARCNET, SONET, SDH, Fiber Distributed Data Interface (FDDI), RS232, IEEE 802.11, IEEE 802.11a, IEEE 802.11b, IEEE 802.11g, IEEE 802.11n, IEEE 802.11ac, IEEE 802.11ad, CDMA, GSM, WiMax and direct asynchronous connections). In one embodiment, the computing device 100 communicates with other computing devices 100 via any type and/or form of gateway or tunneling protocol such as Secure Socket Layer (SSL) or Transport Layer Security (TLS). The network interface 118 may include a built-in network adapter, network interface card, PCMCIA network card, card bus network adapter, wireless network adapter, USB network adapter, modem or any other device suitable for interfacing the computing device 100 to any type of network capable of communication and performing the operations described herein.

In some embodiments, the computing device 100 may include or be connected to one or more display devices 124a-124n. As such, any of the I/O devices 130a-130n and/or the I/O controller 123 may include any type and/or form of suitable hardware, software, or combination of hardware and software to support, enable or provide for the connection and use of the display device(s) 124a-124n by the computing device 100. For example, the computing device 100 may include any type and/or form of video adapter, video card, driver, and/or library to interface, communicate, connect or otherwise use the display device(s) 124a-124n. In one embodiment, a video adapter may include multiple connectors to interface to the display device(s) 124a-124n. In other embodiments, the computing device 100 may include multiple video adapters, with each video adapter connected to the display device(s) 124a-124n. In some embodiments, any portion of the operating system of the computing device 100 may be configured for using multiple displays 124a-124n. One ordinarily skilled in the art will recognize and appreciate the various ways and embodiments that a computing device 100 may be configured to have one or more display devices 124a-124n.

In further embodiments, an I/O device 130 may be a bridge between the system bus 150 and an external communication bus, such as a USB bus, an Apple Desktop Bus, an RS-232 serial connection, a SCSI bus, a FireWire bus, a FireWire 800 bus, an Ethernet bus, an AppleTalk bus, a Gigabit Ethernet bus, an Asynchronous Transfer Mode bus, a FibreChannel bus, a Serial Attached small computer system interface bus, a USB connection, or an HDMI bus.

A computing device or system 100 of the sort depicted in FIGS. 1B and 1C may operate under the control of an operating system, which controls scheduling of tasks and access to system resources. The computing device 100 can be running any operating system such as any of the versions of the MICROSOFT WINDOWS operating systems, the different releases of the Unix and Linux operating systems, any version of the MAC OS for Apple computers, any embedded operating system, any real-time operating system, any open source operating system, any proprietary operating system, any operating systems for mobile computing devices, or any other operating system capable of running on the computing device and performing the operations described herein. Typical operating systems include, but are not limited to: Android, produced by Google Inc.; WINDOWS 7 and 8, produced by Microsoft Corporation of Redmond, Washington; MAC OS, produced by Apple Computer of Cupertino, California; WebOS, produced by Research In Motion (RIM); OS/2, produced by International Business Machines of Armonk, New York; and Linux, a freely-available operating system distributed by Caldera Corp. of Salt Lake City, Utah, or any type and/or form of a Unix operating system, among others.

The computing device 100 can be any workstation, telephone, desktop computer, laptop or notebook computer, server, handheld computer, mobile telephone or other portable telecommunications device, media playing device, a gaming system, mobile computing device, or any other type and/or form of computing, telecommunications or media device that is capable of communication. The computing device 100 has sufficient processor power and memory capacity to perform the operations described herein.

In some embodiments, the computing device 100 may have different processors, operating systems, and input devices consistent with the device. For example, in one embodiment, the computing device 100 is a smart phone, mobile device, tablet or personal digital assistant. In still other embodiments, the computing device 100 is an Android-based mobile device, an iPhone smart phone manufactured by Apple Computer of Cupertino, California, or a Blackberry or WebOS-based handheld device or smart phone, such as the devices manufactured by Research In Motion Limited. Moreover, the computing device 100 can be any workstation, desktop computer, laptop or notebook computer, server, handheld computer, mobile telephone, any other computer, or other form of computing or telecommunications device that is capable of communication and that has sufficient processor power and memory capacity to perform the operations described herein. Aspects of the operating environments and components described above will become apparent in the context of the systems and methods disclosed herein.

B. Frequency Divider

Figure 2:
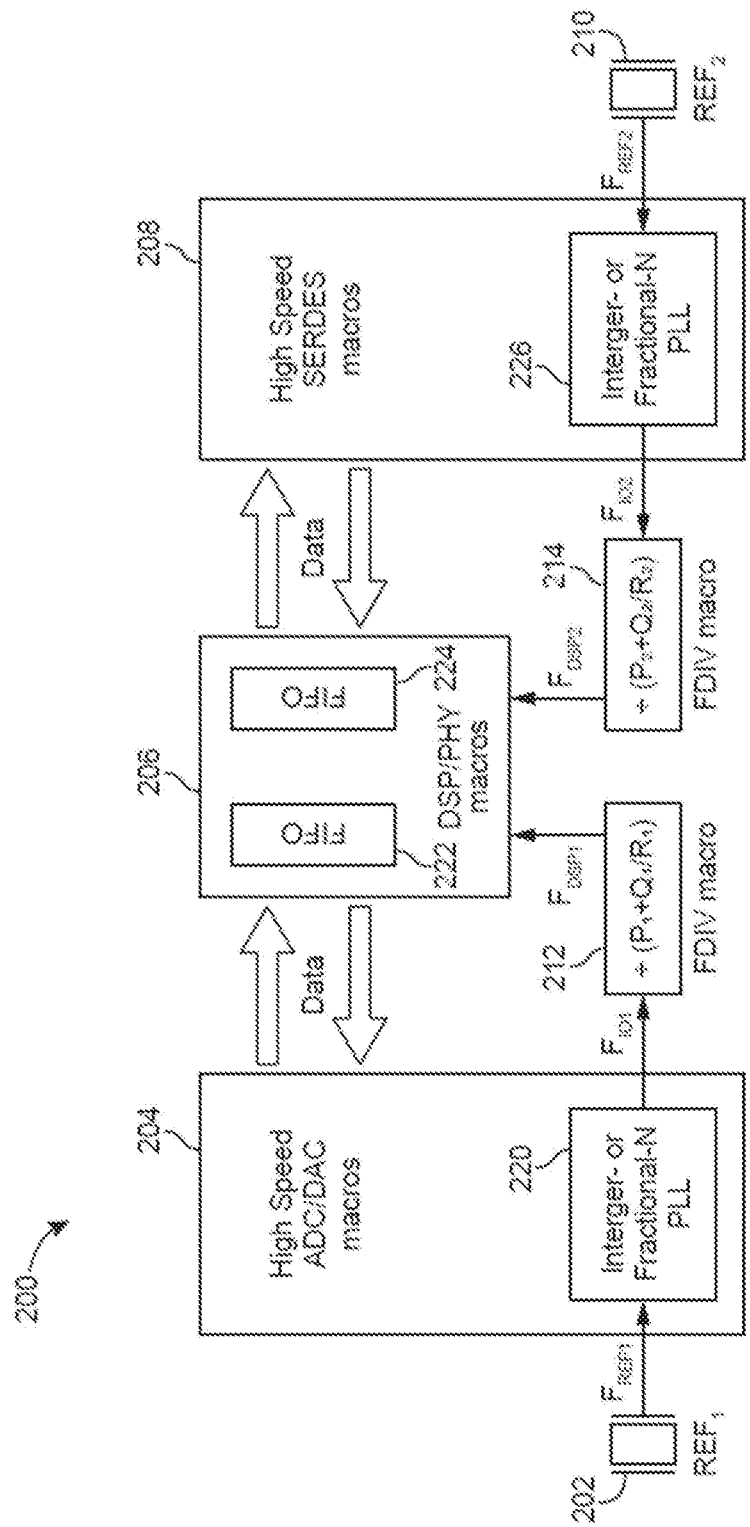
FIG. 2 is a block diagram depicting an exemplary system including a pair of fractional frequency dividers, according to one or more embodiments.

With reference to FIG. 2, a system 200 is a DSP SERDES interface for use in a complex SOC. Although FIG. 2 depicts a particular application, the frequency division systems and methods can be used in any electronic application. System 200 can be used in and/or with the systems described with reference to FIGS. 1A-C.

In some embodiments, the system 200 includes a signal source 202, an analog to digital converter/digital to analog converter (ADC/DAC) unit 204, DSP/PHY unit 206, a high speed SERDES unit 208, a signal source 210, a fractional divider 212, and a fractional divider 214. Units 204, 206 and 208 can operate at different clock frequencies (e.g., driven by different clock signals) in some embodiments. In some embodiments, the fractional divider 212 and fractional divider 214 provide programmable levels of synchronous fractional frequency division for DSP/PHY unit 206 or any other type of electronic device.

Signal source 202 is a crystal integrated circuit that provides a first reference frequency signal at a first frequency in some embodiments. The first reference frequency signal is provided to the ADC/DAC unit 204. Signal source 210 is a crystal integrated circuit that provides a second reference frequency signal at a second frequency in some embodiments. The second reference frequency signal is provided to the SERDES unit 208.

The ADC/DAC unit 204 is a high speed macro, unit, circuit, logic, or other implementation that can provide and receive data to and from DSP/PHY unit 206. ADC/DAC unit 204 includes an integer or fractional N PLL 220 in some embodiments. PLL 220 receives the reference frequency signal from the signal source 202 and provides a clock signal at a first clock frequency. The first clock signal can be a square wave or other signal for driving gates, processors or other logic provided at a frequency $F_{I/O1}$ in some embodiments. The first clock signal can be a divided (e.g., integer or fractional) signal of the reference frequency signal and can be used by The ADC/DAC unit 204 to convert or otherwise process data.

The DSP/PHY unit 206 processes data provided between units 204 and 208. DSP/PHY unit 206 includes first in, first out (FIFO) memory 222 and FIFO memory 224. FIFO memory 222 and FIFO memory 224 handle synchronization for communications between units 204 and 208 relying upon clock signals provided from fractional dividers 212 and 214.

The SERDES unit 208 is a high speed macro, unit, circuit, logic, or other implementation that can provide and receive data to and from DSP/PHY unit 206. SERDES unit 208 includes an integer or fractional N PLL 226 in some embodiments. PLL 226 receives a reference frequency signal from the signal source 210 and provides a clock signal at a second clock frequency. The second clock signal can be a square wave or other signal for driving gates, processors or other logic provided at a frequency $F_{I/O2}$ in some embodiments. The second clock signal can be a divided (e.g., integer or fractional) signal of the second reference frequency signal from signal source 210 and can be used by SERDES unit 208 to convert signals and data. The second clock signal can also be provided to fractional divider 214.

Fractional divider 212 is a macro, unit, circuit, logic, or other implementation that can provide a first divided clock signal at a selectable frequency using fractional division. In some embodiments, the fractional divider 212 divides the first clock signal by a divisor (e.g., the sum of an integer P1 and the quotient of an integer Q1 divided by R1) to provide the first divided signal at a frequency $F_{DSP1}$. Fractional divider 214 is a macro, unit, circuit, logic, or other implementation that can provide a second divided clock signal at a selectable frequency using fractional division. In some embodiments, the fractional divider 214 divides the second clock signal by a divisor (e.g., the sum of an integer P2 and the quotient of an integer Q2 divided by R2) to provide the second divided signal at a frequency $F_{DSP2}$. In some embodiments, fractional dividers 212 and 214 are stand-alone fractional divider (FDIV) macros. In some embodiments, the fractional dividers 212 and 214 may be quadrature frequency dividers which are configured to divide the reference signals by 2.

Units 204 and 208 operate independently at different clock rates, and FIFO memories 222 and 224 handle the synchronization relying on precise ratios between clock frequencies ($F_{I/O1}$, $F_{I/O2}$, ... etc.) and DSP clock frequencies ($F_{DSP1}$, $F_{DSP2}$, etc.) in some embodiments. Fractional dividers 212 and 214 advantageously do not employ multiple dividers and PLL cores to realize the desired ratios ($F_{DSP1}/F_{I/O1}=N_1/M_1$, $F_{DSP2}/F_{I/O2}=N_2/M_2$, etc.) where $N_1$, $M_1$, $N_2$, and $M_2$ are integers in some embodiments. Fractional dividers 212 and 214 advantageously do not occupy large silicon area and do not consume high power, yet meet tighter jitter specifications associated with the increased data rates in some embodiments.

In some embodiments, fractional dividers 212 and 214 are reconfigurable and greatly simplify frequency planning in complex SoCs. In some embodiments, fractional dividers 212 and 214 reuse available high frequency clock signals from units 204 and 208 or share a single PLL core to generate multiple independent output clock signals. In some embodiments, fractional dividers 212 and 214 can achieve exact frequency ratios with very fine delta sigma (ΔΣ) frequency resolution (up to 44 bit) for both numerator and denominator. In some embodiments, fractional dividers 212 and 214 are implemented in an all-digital circuit (e.g., all complementary metal oxide semiconductor (CMOS)) that is compact (e.g., one or two orders of magnitude smaller than a PLL core), scalable and easily portable to newer processes. In some embodiments, the fractional dividers 212 and 214 also achieve excellent low-jitter performance (<0.5 $ps_{rms}$) across process-voltage-temperature (PVT) variations by using an adaptive background calibration technique. In some embodiments, fractional dividers 212 and 214 use an open loop architecture that overcomes the bandwidth limitation of PLLs and achieves ideal spread spectrum modulation and instantaneous frequency switching without any frequency overshoot.

C. Systems for and Methods for Frequency Division Error Correction

Figure 3:
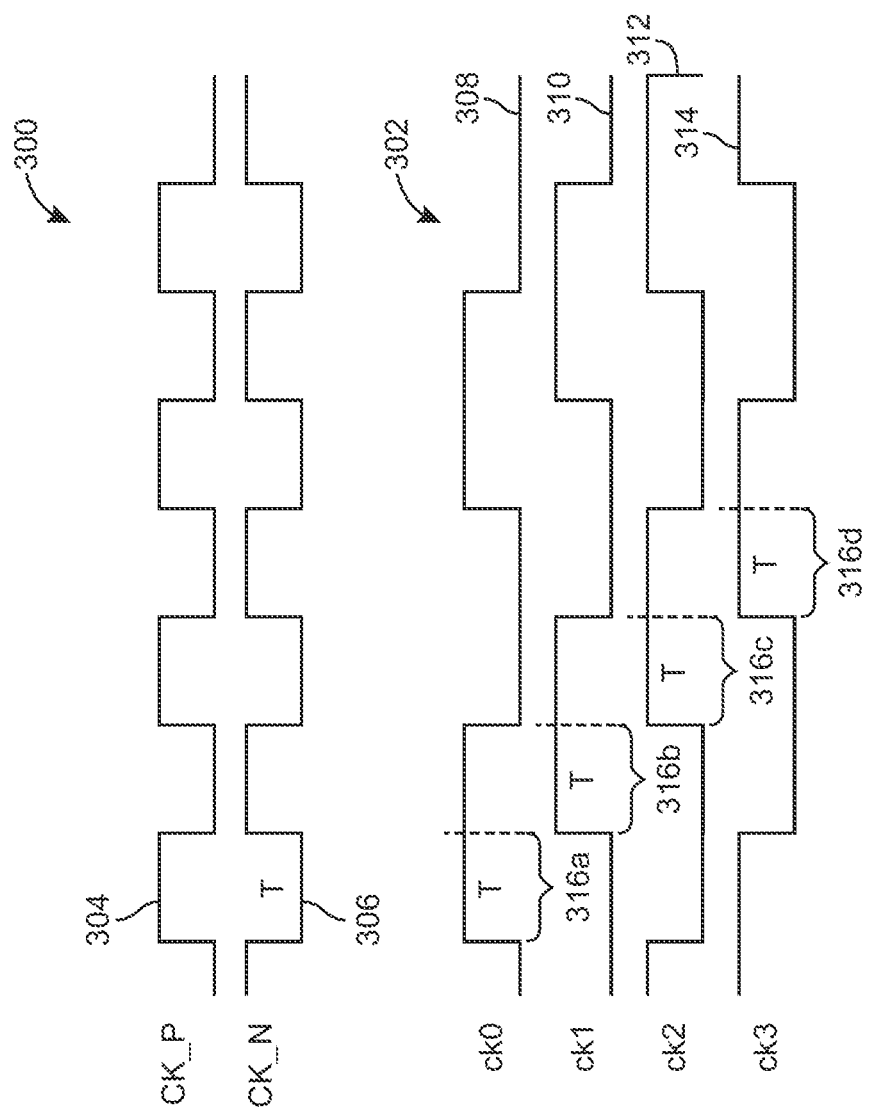
FIG. 3 includes two timing diagrams showing aligned clock signals for a quadrature frequency divider, according to one or more embodiment.

With reference to FIG. 3, timing diagrams 300 and 302 showing aligned clock signals for a quadrature frequency divider are shown, according to an exemplary embodiment. A frequency divider may refer to a circuit which utilizes latches and/or flip flops and is configured to receive a higher frequency input clock signal and divide the frequency of the higher frequency input clock signal to produce a lower frequency output clock signal in some embodiments. The higher frequency input clock signal may refer to the input clock which has a higher frequency than the lower frequency output clock signal in some embodiments. Conversely, the lower frequency input clock signal may refer to the clock signal produced as an output of the frequency divider in some embodiments. A quadrature divider may refer to a type of frequency divider which receives two inputs and produces four outputs in some embodiments. A flip flop may refer a circuit element with two stable states that can be used to store binary data in some embodiments. A latch may refer to a circuit element that has two inputs and one output in some embodiments. Timing diagram 300 includes a first clock signal 304 and a second clock signal 306. The first clock signal 304 is a high frequency clock signal "CK_P". The second clock signal 306 is a complementary clock signal "CK_N" which has the opposite duty cycle as the first clock signal 304. The first clock signal 304 and the second clock signal 306 may be used as input clocks to a clock frequency divider used to create quadrature clock signals included in the second timing diagram 302. For example, in some embodiments, the first clock signal 304 may be used as signal source 202 while the second clock signal 306 may be used as the signal source 210.

The timing diagram 302 demonstrates the output clock signals 308, 310, 312, and 314 from the quadrature divider. As can be seen, the frequency of the output clock signals 308, 310, 312, and 314 is divided by 2. Further, as can be seen in timing diagram 302, the time-spacing 316a-316d between each of the clock signals are equally and ideally spaced. This type of spacing demonstrates an ideal quadrature divider without clock signal spacing error.

Figure 4:
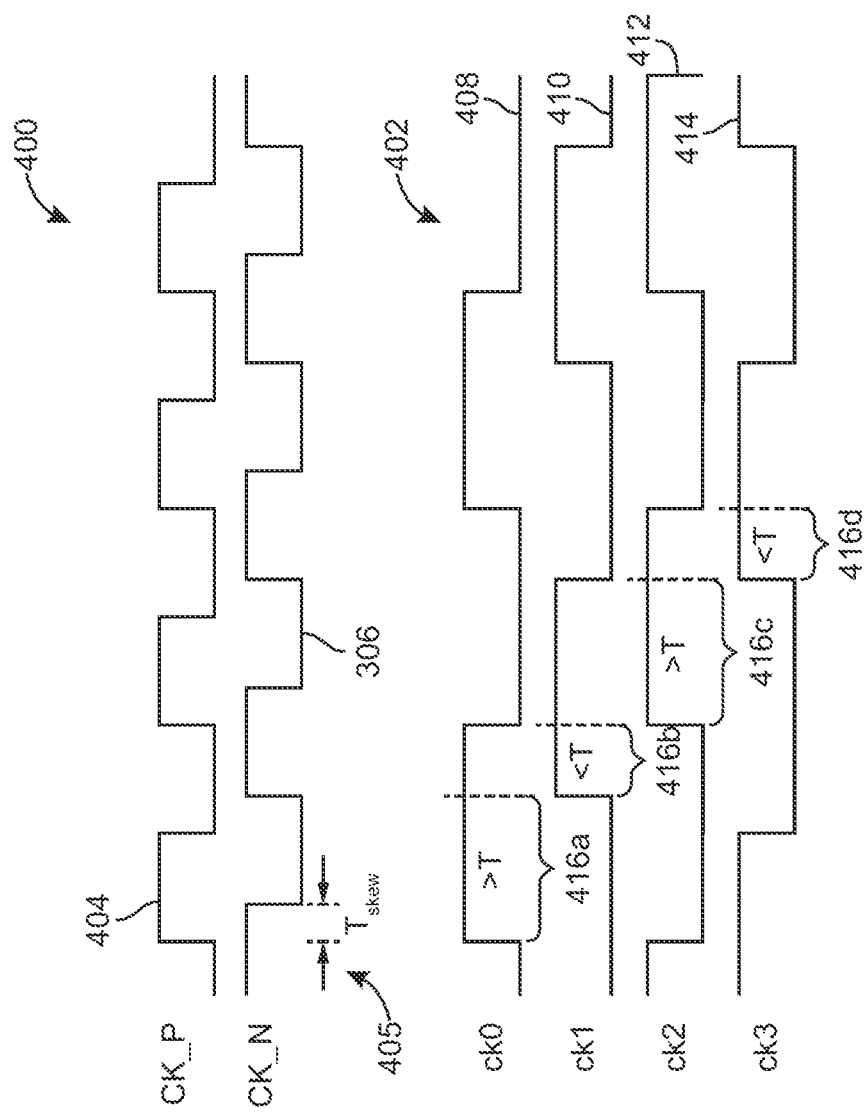
FIG. 4 is a timing diagram showing a first skewed clock signals for a quadrature frequency divider, according to one or more embodiments.

With reference to FIG. 4, timing diagrams 400 and 402 showing clock signals for a quadrature frequency divider with clock signal spacing error are shown, according to an exemplary embodiment. A clock signal spacing error may refer to an output of a clock frequency divider where the timing of the rising edges is not equal between each of the output clock signals in some embodiments. The timing diagrams 400 and 402 are similar to timing diagrams 300 and 302 respectively except the clock signals shown in FIG. 4 are skewed. Timing diagram 400 includes a first clock signal 404 and a second clock signal 406. The first clock signal 404 is a high frequency clock signal "CK_P". The second clock signal 406 is a complementary clock signal "CK_N" which has the opposite duty cycle as the first clock signal 404. As can be seen in FIG. 4, the timing of the second signal 406 is skewed by timing 405. The first clock signal 404 and the second clock signal 406 may be used as input clocks to a clock frequency divider used to create quadrature clock signals included in the second timing diagram 402. For example, in some embodiments, the first clock signal 404 may be used as signal source 202 while the second clock signal 406 may be used as the signal source 210.

The timing diagram 402 demonstrates the output clock signals 408, 410, 412, and 414 from the quadrature divider. As can be seen, the frequency of the output clock signals 408, 410, 412, and 414 is divided by 2. Further, as can be seen in timing diagram 402, the time-spacing 416a-416d between each of the clock signals are not equally and not ideally spaced. This type of spacing demonstrates a quadrature divider with clock signal spacing error.

Figure 5:
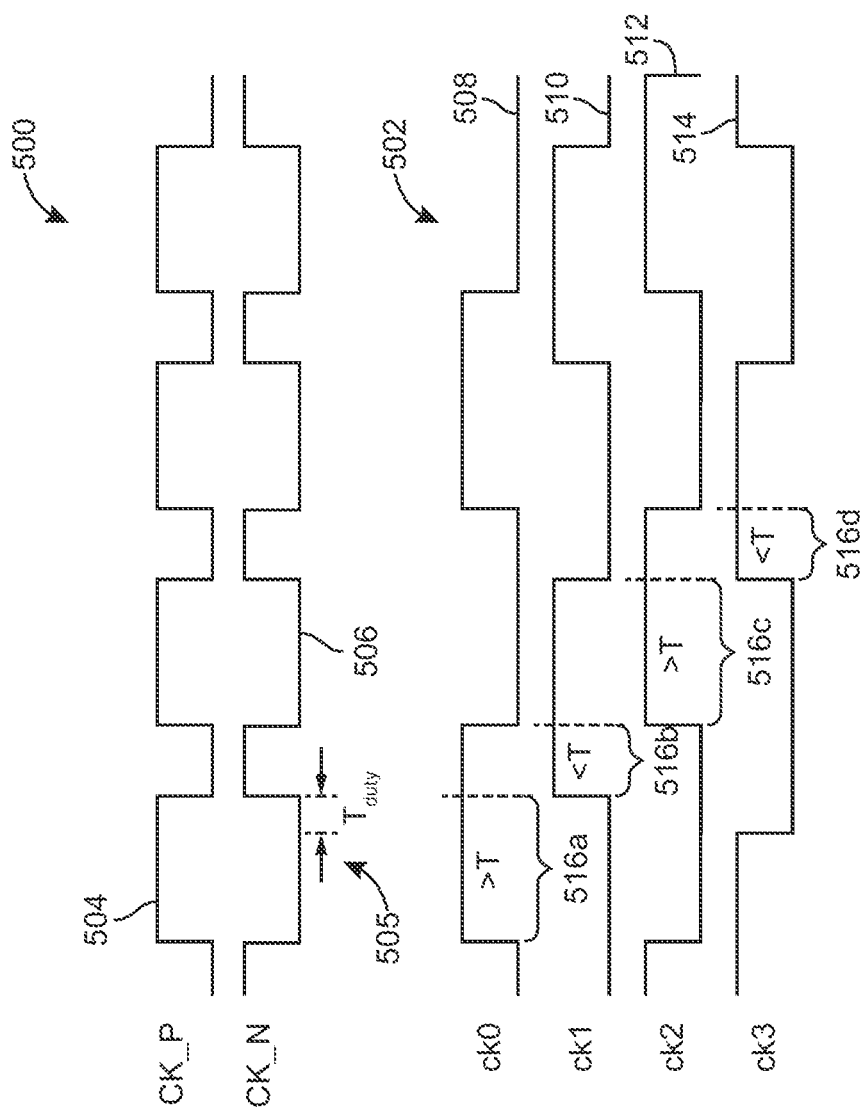
FIG. 5 is a timing diagram showing a second skewed clock signals for a quadrature frequency divider, according to one or more embodiments.

With reference to FIG. 5, timing diagrams 500 and 502 showing clock signals for a quadrature frequency divider with clock signal spacing error are shown, according to an exemplary embodiment. The timing diagrams 500 and 502 are similar to 500 and 502 respectively except the clock signals shown in FIG. 5 are skewed because the input signals have a duty cycle over 50%. Timing diagram 500 includes a first clock signal 504 and a second clock signal 506. The first clock signal 504 is a high frequency clock signal "CK_P". The second clock signal 506 is a complementary clock signal "CK_N" which has the opposite duty cycle as the first clock signal 504. As can be seen in FIG. 5, the duty cycle of each of the first clock signal 504 and the second clock signal 506 is higher than 50%. The first clock signal 504 and the second clock signal 506 may be used as input clocks to a clock frequency divider used to create quadrature clock signals included in the second timing diagram 502. For example, in some embodiments, the first clock signal 504 may be used as signal source 202 while the second clock signal 506 may be used as the signal source 210.

The timing diagram 502 demonstrates the output clock signals 508, 510, 512, and 514 from the quadrature divider. As can be seen, the frequency of the output clock signals 508, 510, 512, and 514 is divided by 2. Further, as can be seen in timing diagram 502, the time-spacing 516a-516d between each of the clock signals are not equally and not ideally spaced because the duty cycles of the clock signals 504 and 506. This type of spacing demonstrates a quadrature divider with clock signal spacing error.

Figure 6:
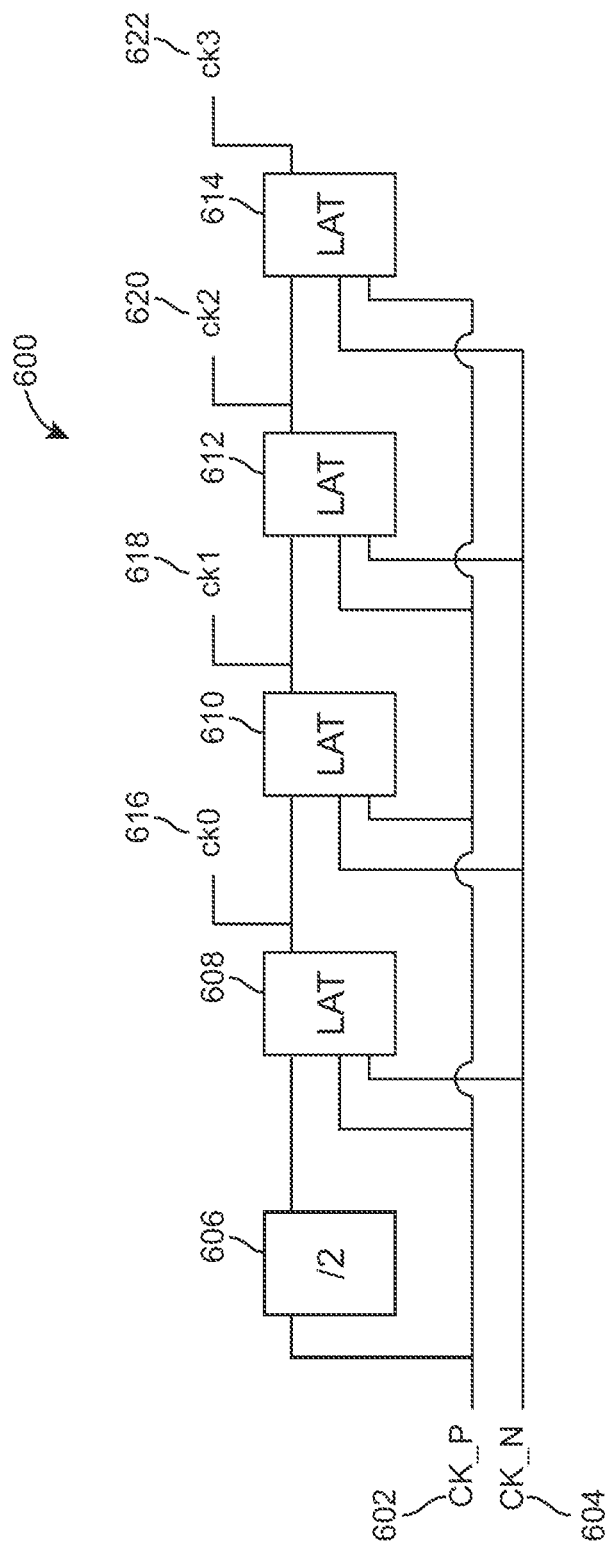
FIG. 6 is a schematic circuit diagram showing a quadrature frequency divider, according to one or more embodiments.

With reference to FIG. 6, a circuit diagram 600 showing a quadrature frequency divider 606 is shown, according to an exemplary embodiment. The circuit diagram 600 includes a flip flop 606 which is configured to divide the frequency of the input clock signals 602 and 604. Specifically, the flip flop 606 may be divide-by-two flip flop which may be circuit component which is configured to receive an input signal and produce an output signal with half the frequency of the input signal. Specifically, the input clock signal 602 is fed into the frequency divider 606. The divided frequency signal from frequency divider 606 is then fed into each of the latches 608, 610, 612, and 614. Each of the input clock signals 602 and 604 are used to alternatively clock the latches 608, 610, 612, and 614 to create output frequency divided signals 616, 618, 620, and 622. In some embodiments, each of the latches 608, 610, 612, and 614 may be the same. In one embodiment, the input clock signals 602 and 604 each have a duty cycle of 50% and no skew. In such a case, the output frequency signals 608, 610, 612, and 614 will not have any clock signal spacing error. However, in a different embodiment, the input clock signals 602 and 604 may have a duty cycle above or below 50% and/or may have some skewed timing. In such a case, the quadrature frequency divider 606 may be used in conjunction with an error correction system which may create controllable input clock signals 602 and 604 in order to cancel the clock signal spacing error. The error correction system is explained in more detail with respect to FIG. 7 below.

Figure 7:
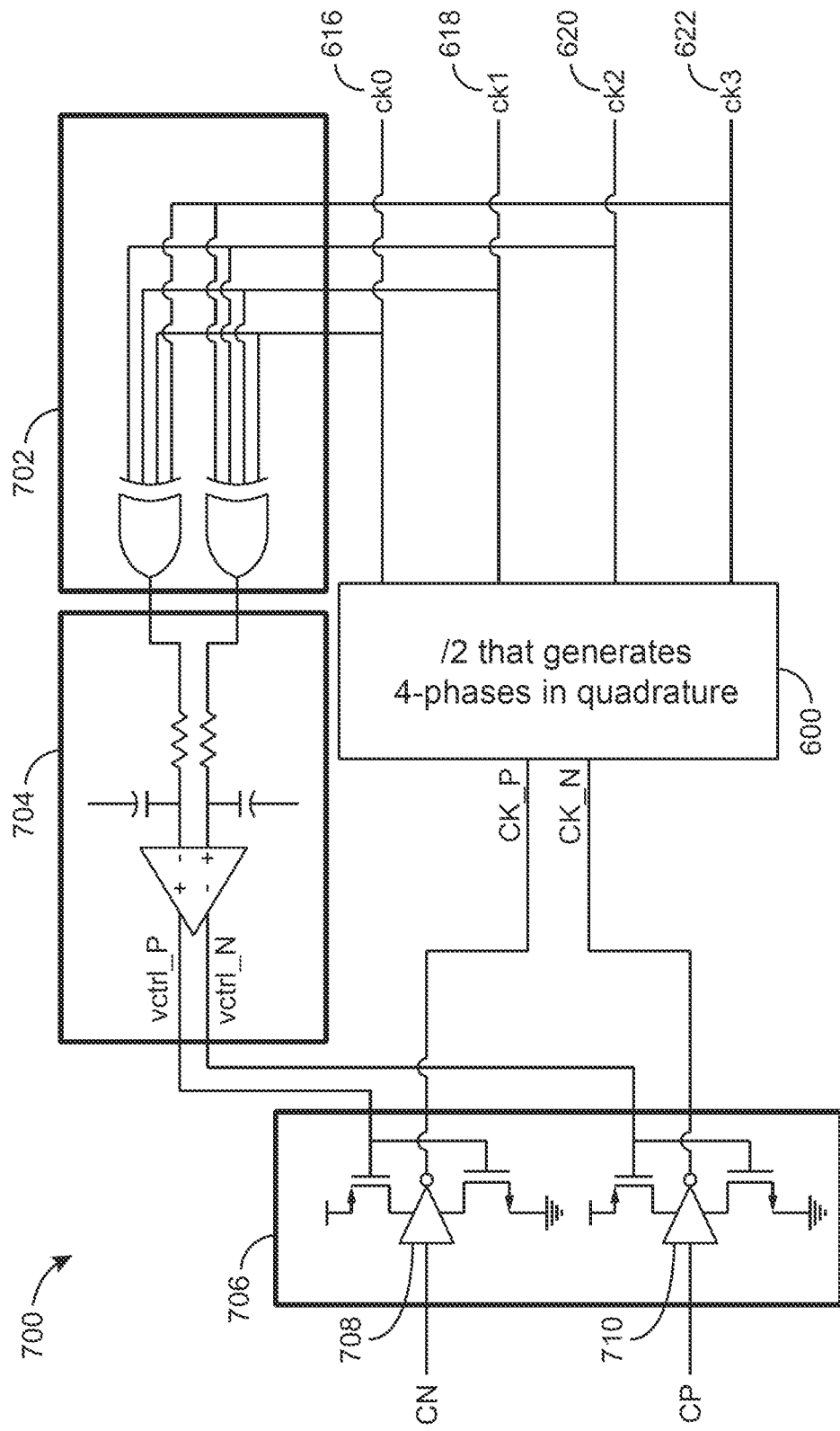
FIG. 7 is block diagram of an error correction system for the quadrature frequency divider of FIG. 6, according to one or more embodiments.

With reference to FIG. 7, an error correction system 700 is shown, according to an exemplary embodiment. The error correction system 700 includes the quadrature divider 606, a phase detector 702, a low pass filter 704, and a clock signal control unit 706. The phase detector may refer to one or more logic gates which may be used to measure the difference between the clock signals in some embodiments. The difference may refer to timing difference between the different lower frequency output clock signals in some embodiments. The low pass filter 704 may refer to a filter which passes signals with a frequency lower than a certain threshold in some embodiments. The control unit 706 may refer to a computing circuit which is configured to correct any clock signal spacing error observed within the error correction system in some embodiments. The clock signals "CK_P" and "CK_N" are used as inputs to the quadrature divider 606. As described above, the quadrature divider 606 produces frequency divided output signals 616, 618, 620, and 622. As described above, in some embodiments, a clock signal spacing error may be observed in the output clock signals 616, 618, 620, and 622 depending on whether there is skewed timing between the input clock signals "CK_P" and "CK_N". The clock signal spacing error may refer to the timing between output clock signals 616, 618, 620, and 622 being either above or below a certain time in some embodiments. In other embodiments, a clock signal spacing error may be observed in the output clock signals 616, 618, 620, and 622 if the duty cycle of the input clock signals "CK_P" and "CK_N" is below or above 50%. The clock signal error may be corrected by the error correction system 700.

Figure 8:
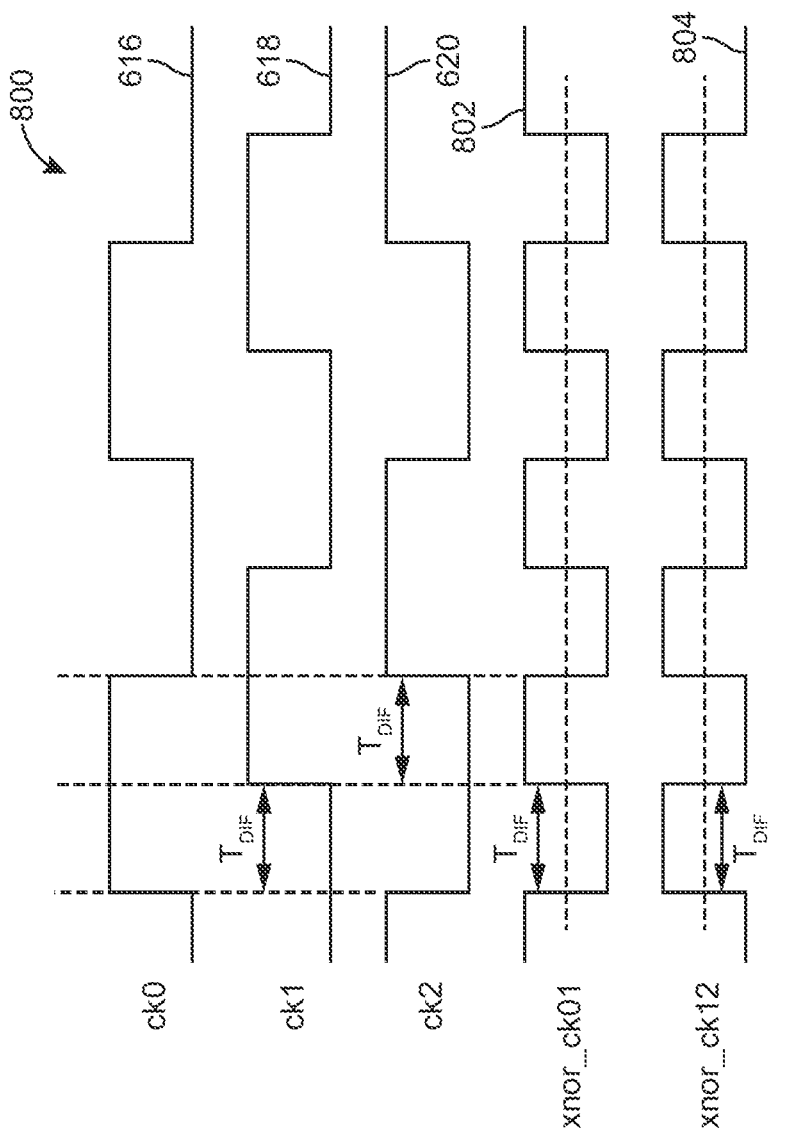
FIG. 8 is a first timing diagram showing clock signals associated with a phase detector of the error correction system of FIG. 7, according to one or more embodiments.
Figure 9:
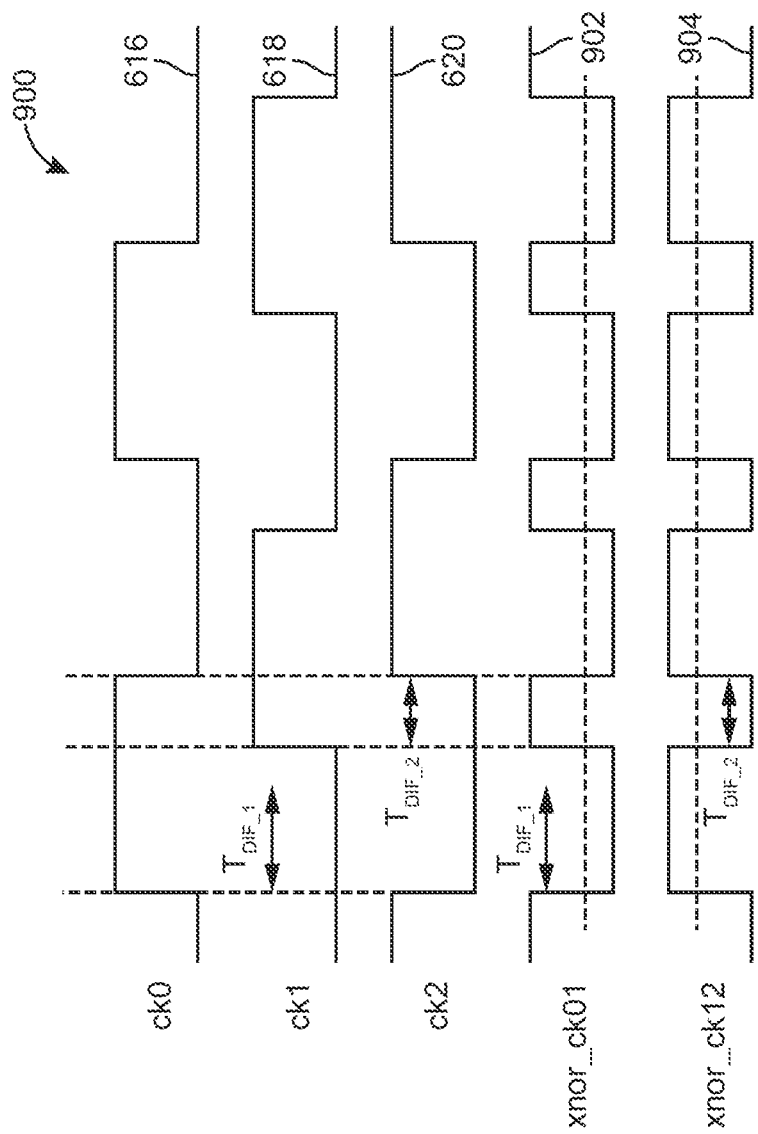
FIG. 9 is a second timing diagram showing clock signals associated with a phase detector of the error correction system of FIG. 7, according to one or more embodiments.

The output clock signals 616, 618, 620, and 622 may be used as an input to the phase detector 702. The phase detector 702 may include two XOR gates which are configured to receive the output clock signals 616, 618, 620, and 622 and determine the difference between the rising edges of the output clock signals 616, 618, 620, and 622. An XOR gate may be defined as a digital logic gate that provides a true output (e.g., high or 1) when the number of true inputs is odd. In some embodiments, an XOR gate may function as an inverter which may be activated or deactivated by a switch. In some embodiments, the phase detector 702 may include x-nor gates instead of XOR gates. One of the XOR gates may be configured to measure the difference between output signal 616 and output signal 618 while the second XOR gate measures the difference between output signal 618 and 620. Further, in some embodiments, the XOR gates of the phase detector 702 may be configured to also measure the difference between output signal 620 and output signal 622 and the difference between output signal 616 and output signal 622. For example, with reference to FIG. 8, timing diagram 800 showing clock signals associated with a phase detector 702, is shown according to an exemplary embodiment. Specifically, the timing diagram 800 shows the output of the two XOR gates of the phase detector 702. The output of the two XOR gates in the phase detector 702 are signals which demonstrate the difference between the rising edge of one clock and the rising edge of the other clock. For example, signal 802 shows the difference between the rising edge the first clock signal 616 and the rising edge of the second clock signal 618. As another example, the signal 804 shows the difference between the rising edge of the second clock signal 618 and the third clock signal 620. The signals 802 and 804 demonstrate that no clock signal spacing error was detected by the phase detector 702 because the signals 802 and 804 each have a duty cycle of 50%. In contrast, the output signals of the XOR gates demonstrated in FIG. 9 is a timing diagram which demonstrates that a clock signal spacing error has been detected. Specifically, the timing diagram 900 shows the output of the two XOR gates of the phase detector 702. The output of the two XOR gates in the phase detector 702 are signals which demonstrate the difference between the rising edge of one clock and the rising edge of the other clock. For example, signal 902 shows the difference between the rising edge the first clock signal 616 and the rising edge of the second clock signal 618. As another example, the signal 904 shows the difference between the rising edge of the second clock signal 618 and the third clock signal 620. The signals 902 and 904 demonstrate that a clock signal spacing error was detected by the phase detector 702 because the signals 902 and 904 each have a duty cycle below or above 50%.

Referring back to FIG. 7, the output signals from the XOR gates are fed into the low pass filter 704 which is configured to measure and amplify the clock signal spacing error as determined by the phase detector 702. Based on the measured and amplified clock signal spacing error, the low-pass filter may determine control signals "vctrl_p" and "vctrl_n." A control signal may refer to an electrical or communication signal which may be configured to control the action of an electronic circuit component or device. Measuring the clock signal may refer to determining the amount of clock signal spacing error that is present in the output signals in some embodiments. The amplified clock signal spacing error may refer to a clock signal spacing error measurement that has been proportionally increased in some embodiments. The control signals may then be fed into the clock signal control unit 706. The clock signal control unit 706 is configured to receive the control signals and generate corrected higher frequency input clock signals "CK_N" and "CK_P" to correct for any clock signal spacing error. The corrected higher frequency input clock signals "CK_N" and "CK_P" may refer to higher frequency input clock signals which have been modified to account for any clock signal spacing error in some embodiments. Specifically, the clock signal control unit 706 may include one or more current-starved inverters 708 and 710 which are used to drive the corrected input clock signals "CK_N" and "CK_P". The control voltage for the generation of CK_N is the 'opposite' (other differential signal) from that that creates CK_P. Thus, the control signals go to separate current-starved inverter paths, and this leads to controllable and clock signal spacing error free duty cycle. Additional skew correction is possible by including CMOS inverters between CK_P and CK_N (not shown).

Figure 10A:
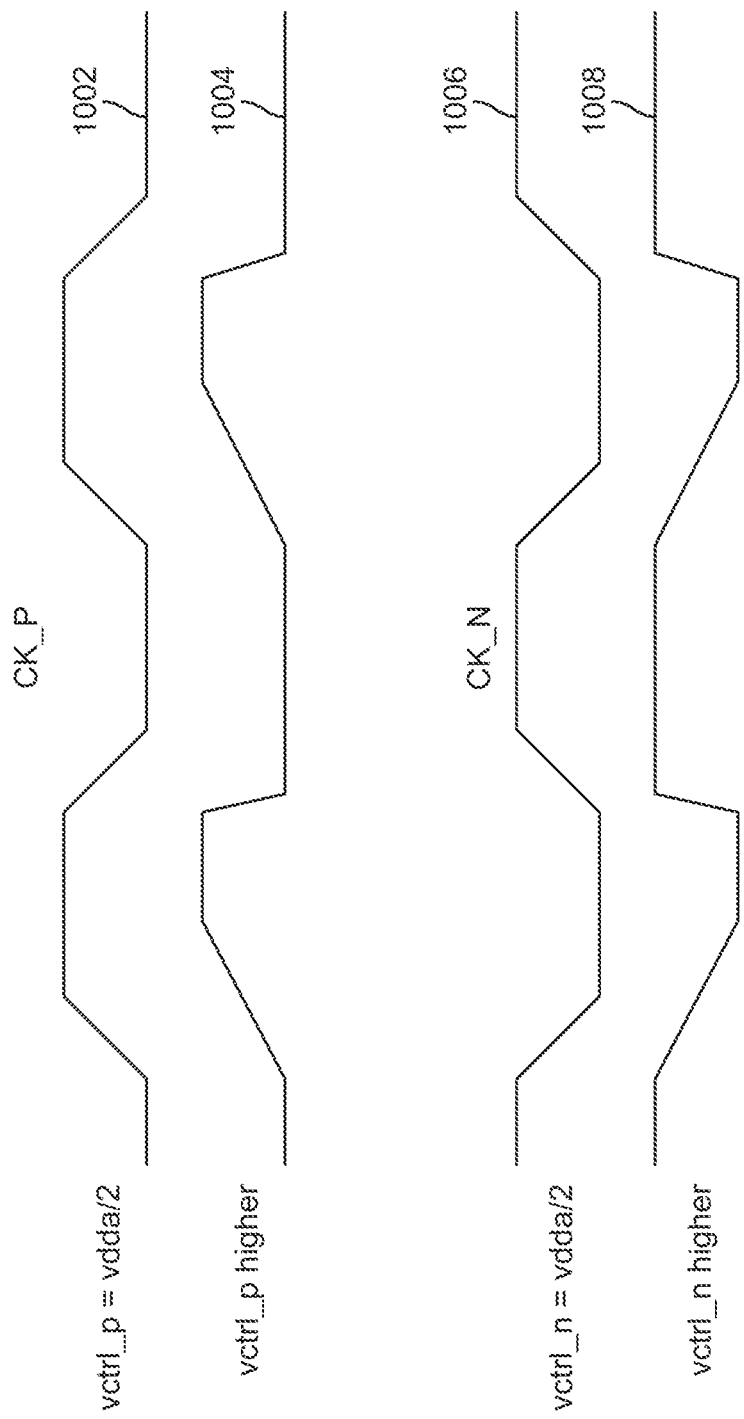
FIGS. 10A-10B show control signals for controlling the clock signals and the corresponding clock signals created by the control signals, according to one or more embodiments.
Figure 10B:
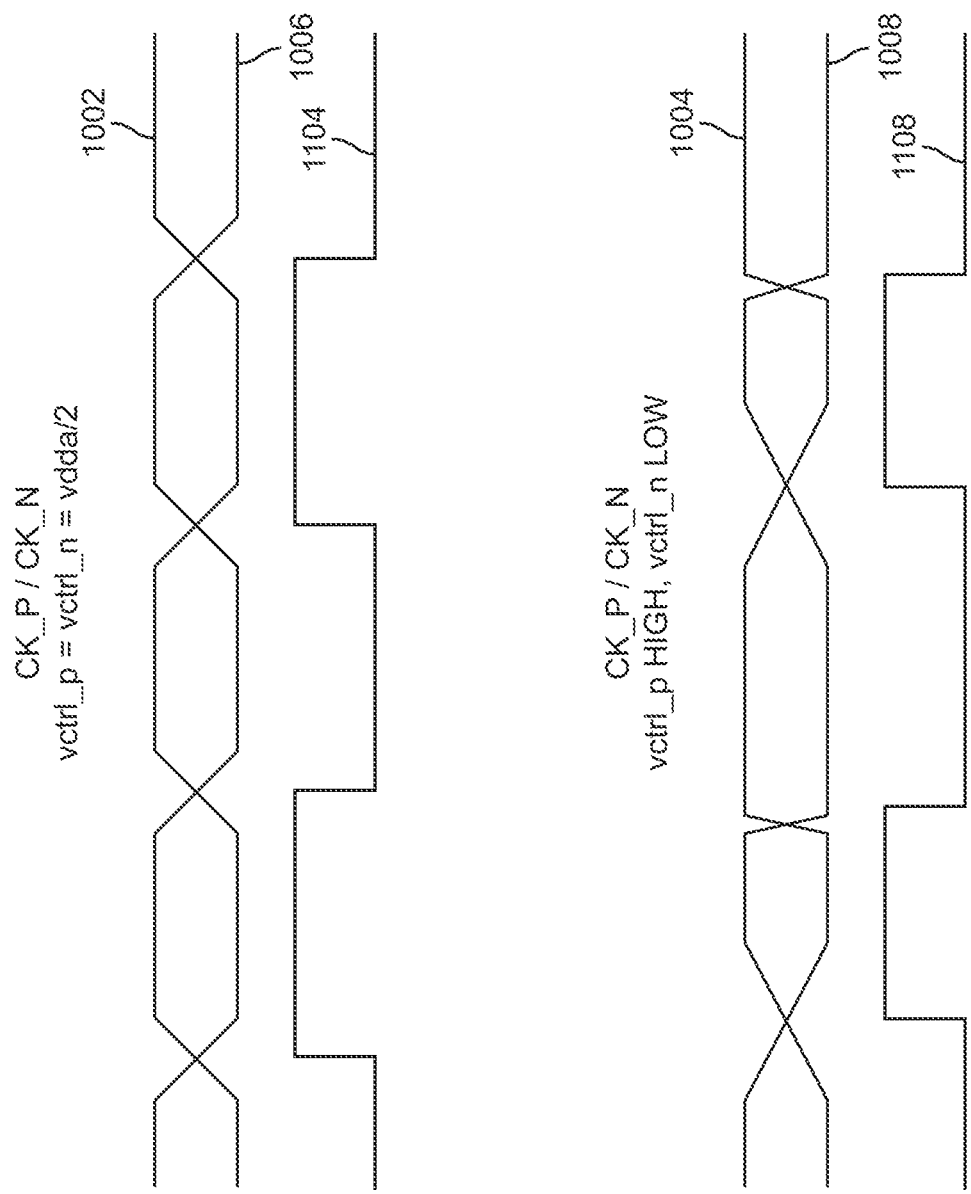

Referring now to FIGS. 10A-10B, control signals for controlling the input clock signals "CK_N" and "CK_P" and the corresponding input clock signals created by the control signals is shown, according to an exemplary embodiment. In FIG. 10A, the first control signal 1002 and the third control signal 1006 are the control signals generated when no clock signal spacing error is detected by the phase detector 702. In such a case, the rising edge and/or falling edge of the control signals 1002 and 1006 do not need to be adjusted to account for and correct any clock signal spacing error. When combined, as shown in FIG. 10B, the voltage control signals 1002 and 1006 create an input clock signal 1104 (e.g., "CK_N" or "CK_P") which has a standard 50% duty cycle. Referring back to FIG. 10A, the second clock signal 1004 and the fourth clock signal 1008 are control signals generated when a clock signal spacing error is detected by the phase detector 702. In such a case, the rising edge and/or the falling edge may be lengthened or shortened to adjust for any clock signal spacing error. When combined, as shown in FIG. 10B, the voltage control signals 1004 and 1008 create an input clock signal 1108 (e.g., "CK_N" or "CK_P") which has an adjusted duty cycle (e.g., above or below 50%).

D. Systems for and Methods for Synchronization of Multiple Frequency Dividers

In many analog to digital converters (ADCs), deserializer circuits in link communication (SERDES), or even radio receivers (RF radios), the information is processed synchronously with a clock. As the data rates have increased to well above 20 Gb/s, it is generally preferred to process the data with multiple sub-rate clocks. For example, in one embodiment, a data rate of 20 Gb/s can be captured with two 10 GHz clocks, or four 5 GHz clocks, etc. When using such sub-rate clocks in communication systems with a certain data rate (e.g., 20 Gb/s), it may be desired that the multiple sub-rate clocks are as equally spaced in time as possible so that the timing reference is equal to the full data rate itself. For example, in the case of a 20 Gb/s system, the timing reference would be at 20 GHz, or a period of 50 ps. In such a case, the data rate may be implemented with a sub-rate system with four 5 GHz clocks, where ideally the four clocks' rising edges (timing references) are to be spaced by exactly 50 ps. To ensure this, the sub-rate clocks may be synchronized when dividing the frequency to create the sub-rate clocks. The systems and methods described herein provide a technique for providing such a synchronization. Synchronization may refer to a process for ensuring that the timing of the sub-rate clock signals is matched with the timing of the higher frequency clock signals in some embodiments.

Figure 11:
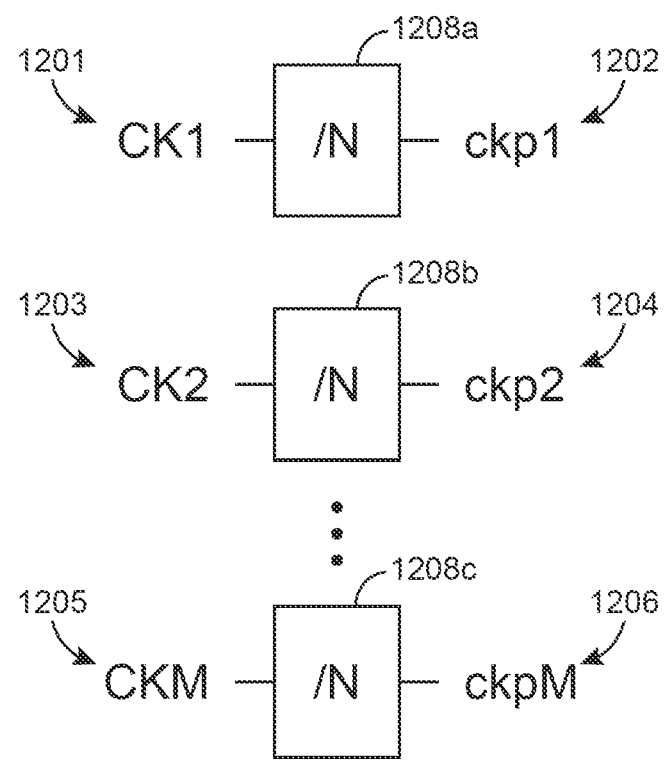
FIG. 11 is a schematic diagram showing multiple high-speed clocks undergoing frequency division to generate multiple sub-rate clocks, according to one or more embodiments.
Figure 12:
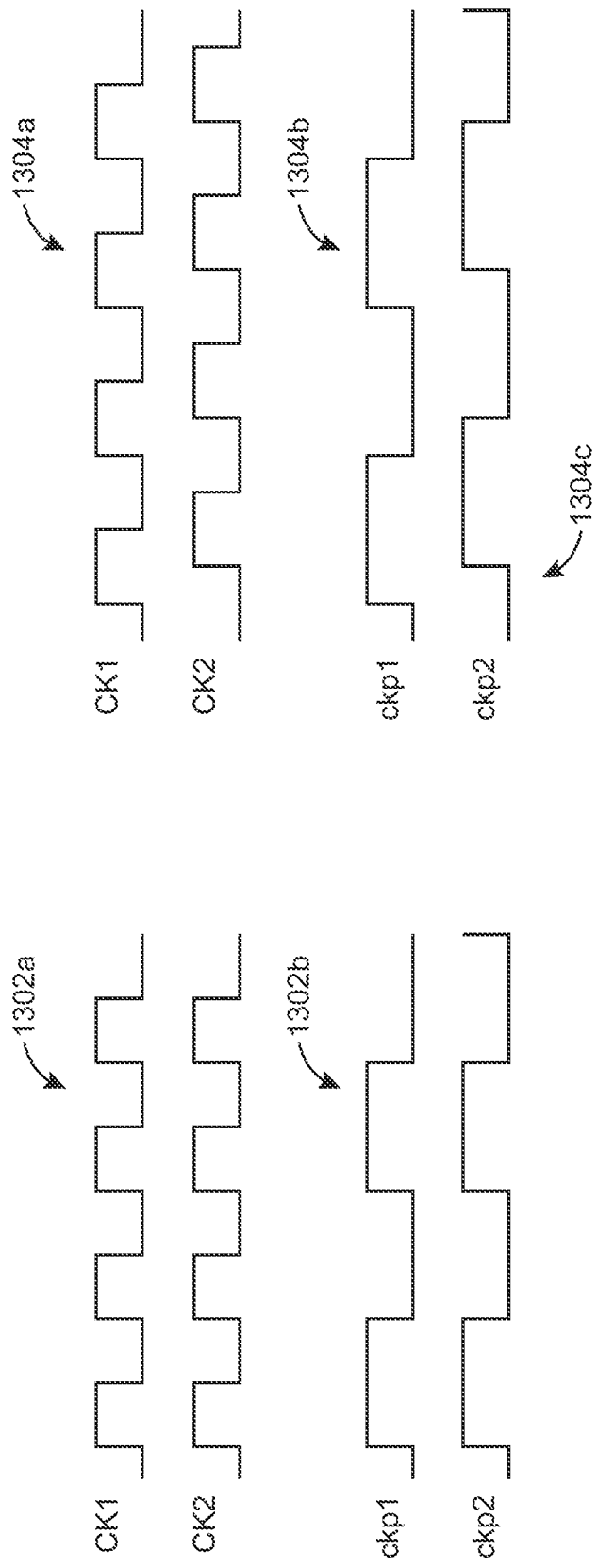
FIG. 12 is a first timing diagram showing clocks for the multiple high-speed clocks and sub-rate clocks of FIG. 11, according to one or more embodiments.

Referring now to FIG. 11, a schematic diagram showing multiple high-speed clocks 1201, 1203, and 1205 which go through frequency division by one or more frequency dividers 1208a-1208c to generate multiple sub-rate clocks 1202, 1204, and 1206, is shown. For example, high speed clock CK1 may go through a frequency divider (e.g., frequency divider 600, a fractional divider 212, and a fractional divider 214, etc.) to create a sub-rate clock 1202. "Sub-rate" means that the frequency of the sub-rate clock is less than the data rate itself, and generally is an integer division. The timing diagrams associated with the high-speed clocks 1201, 1203, and 1205 and the sub-rate clocks 1202, 1204, and 1206 are shown in FIG. 12. It may be desired that each of the sub-rate clocks 1202, 1204, and 1206 are synchronized by ensuring that the frequency dividers are synchronized. The frequency dividers may become unsynchronized because they do not have a known initial state. For example, as shown in FIG. 12, both of the sub-rate clocks 1302b may have an initial state of low which matches the initial state of the high frequency clocks 1302a. Therefore, the sub-rate clocks 1302b are synchronized. In contrast, one of the sub-rate clocks 1304c does not have an initial state which matches that of the other sub-rate clock 1304b or the high frequency clock 1304a. Therefore, the sub-rate clocks 1304 are not synchronized. The systems and methods described herein provide a way of synchronizing the clocks without the use of an additional high-frequency clock using only the information provided by the sub-rate clocks. Specifically, one sub-rate clock is assigned as the "master" and each sub-rate clock is compared to the master's sub-rate clock and individually synchronizes itself to the master sub-rate clock which produces a master sub-rate clock signal. A master sub-rate clock signal may refer to a clock signal associated with the master sub-rate clock in some embodiments. A follower sub-rate clock may be a sub-rate clock which is synchronized to the master sub-rate clock. A follower sub-rate clock signal may refer to a clock signal associated with the follower sub-rate clock in some embodiments. Based on the comparison to the master sub-rate clock, a slip divider may be applied to a clock divider of a follower sub-rate clock. The slip divider is explained in more detail below with respect to FIGS. 13A-13C. For example, in one embodiment, the first sub-rate clock 1202 may be assigned as the "master sub-rate clock." In such a case, it is the relation between the second sub-rate clock 1204 and the third sub-rate clock 1206 which determines whether the clocks are synchronized or not. In some embodiments, the process for comparing the other sub-rate clocks to the master sub-rate clock may be done independently and simultaneously to save time. Independently and simultaneously synchronizing the sub-rate clocks may refer to multiple sub-rate clocks being synchronized without impacting each other at the same time in some embodiments. The process for comparing the sub-rate clocks to the master sub-rate clocks is explained in more detail with respect to FIGS. 14-17 below.

Figure 13A:
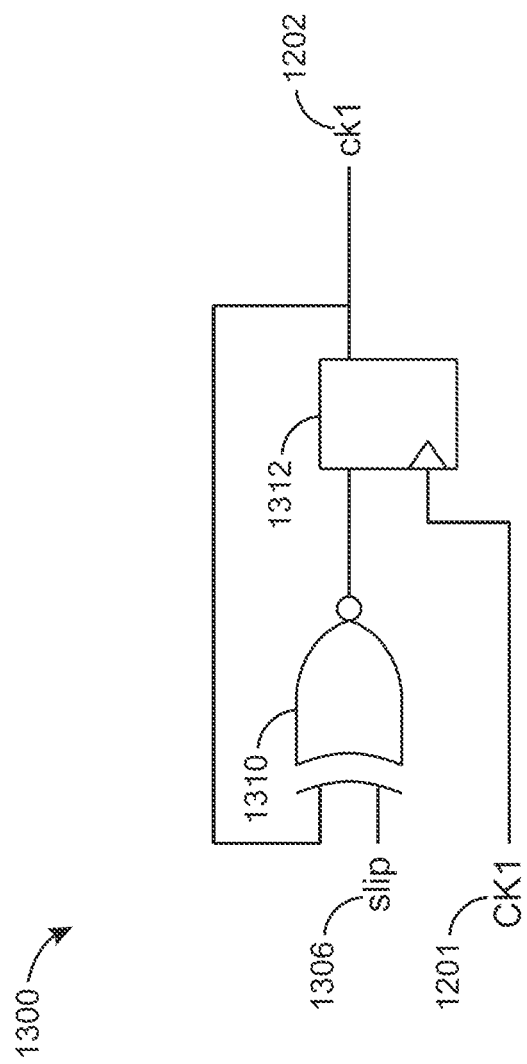
FIG. 13A is a schematic diagram of a circuit for a slip divider used to synchronize multiple sub-rate clocks, according to one or more embodiments.

Referring now to FIG. 13A, a circuit diagram for a slip divider 1300 is shown, according to an exemplary embodiment. In a typical frequency divider, the rising edge of a high frequency clock (e.g., "CK1," "CK2," and/or "CK3") causes the sub-rate clock to toggle from a high position to a low position or vice versa which causes the position of the sub-rate clock to be directly correlated to the high frequency clocks. The slip divider 1300, in contrast, includes an additional slip signal and the sub-rate clock toggles based on both the slip signal and the rising edge of the high frequency clocks. A slip signal may refer to a control signal which causes the one or more of the sub-rate clocks to stay low for one or more periods in some embodiments. Specifically, the slip divider 1300 includes an XNOR gate 1310 which includes a slip signal 1306. The output of the XNOR gate 1310 is used as an input to the flip-flop 1312 which generates the sub-rate clock 1202. When the slip signal 1306 is low, the XNOR gate 1310 acts like a inverter and the sub-rate clock 1202 toggles as normal and is directly tied to the rising edge of the high frequency clock 1308 (e.g., like in a typical divider). When the slip signal 1306 is high, then the flip-flop 1312's input will be the same as the sub-rate clock 1202 and the sub-rate clock 1202 will not toggle on the rising edge of the high frequency clock 1308. In some embodiments, it may be desired that the slip signal 1306 be synchronized with the high frequency clock 1308 so that the slip signal 1306 masks a desired number of rising edges for the high frequency clock 1308. If it is determined that a sub-rate clock 1202 is not synchronized based on a comparison with the master clock, then the slip signal 1306 may be activated so that it is high, which synchronizes the sub-rate clock 1202 with the master clock.

Figure 13B:
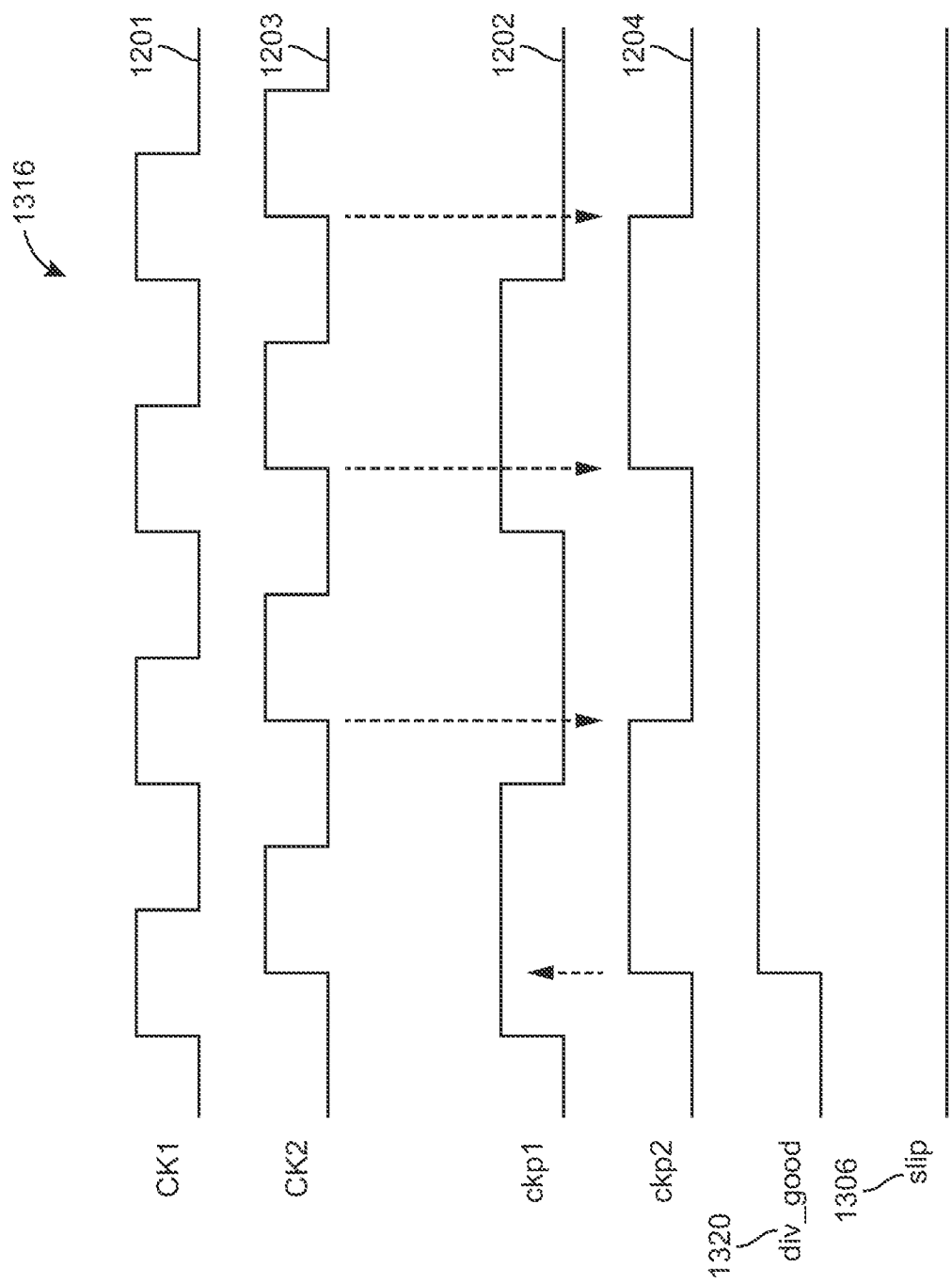
FIGS. 13B-13C is a waveform diagram showing the waveforms signals for a clock frequency divider synchronization technique, according to one or more embodiments.
Figure 13C:
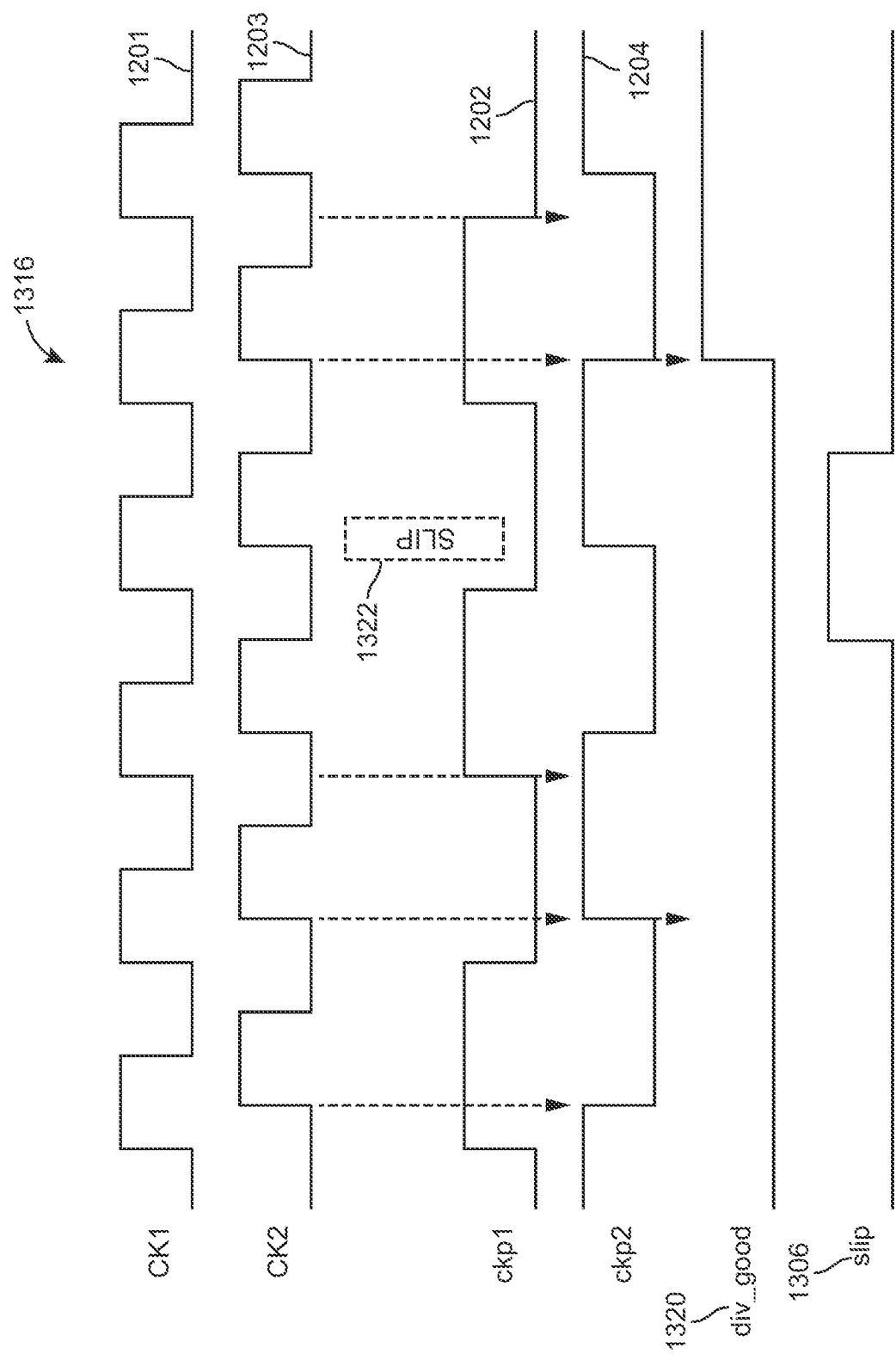

Referring now to FIG. 13B-13C, waveform diagrams 1316 and 1318 including signals associated with the slip divider 1300, is shown, according to an exemplary embodiment. The waveform diagram 1316 shows the signals associated with the slip divider 1300 when the slip signal 1306 is low. The waveform diagram 1318 shows the signals associated with the slip divider 1300 when the slip signal 1306 is high. As can be seen in the waveform 1316, the sub-rate clocks 1201 and 1203 are synchronized with the high frequency clocks 1202 and 1204. Because the clocks are all synchronized, the div_good signal 1320 is set to high in waveform diagram 1316. The div_good signal 1320 may be described as the control signal which determines when the slip should be activated based on the comparison between different sub-rate clocks and the master sub-rate clock. If the comparison shows that the other sub-rate clocks are synchronized to the master sub-rate clock, then the div_good signal 1320 will be high and the slip signal 1306 will be low. In contrast, if the comparison shows that the other sub-rate clocks are not synchronized to the master sub-rate clock, then the div_good signal 1320 will be low and the slip signal 1306 will be activated to be high. Waveform diagram 1318 shows an exemplary embodiment in which the sub-rate clocks are not synchronized and the slip signal 1306 is activated to be high. As shown in FIG. 13C, the div_good signal 1320 is low which indicates that the sub-rate clock 1204 is not synchronized with the sub-rate clock 1202. Once it has been determined that the sub-rate clocks are not synchronized, a slip signal 1322 may be applied to the sub-rate clock 1204 which causes the sub-rate clock 1204 to not toggle for one rising edge of the master clock.

Figure 14:
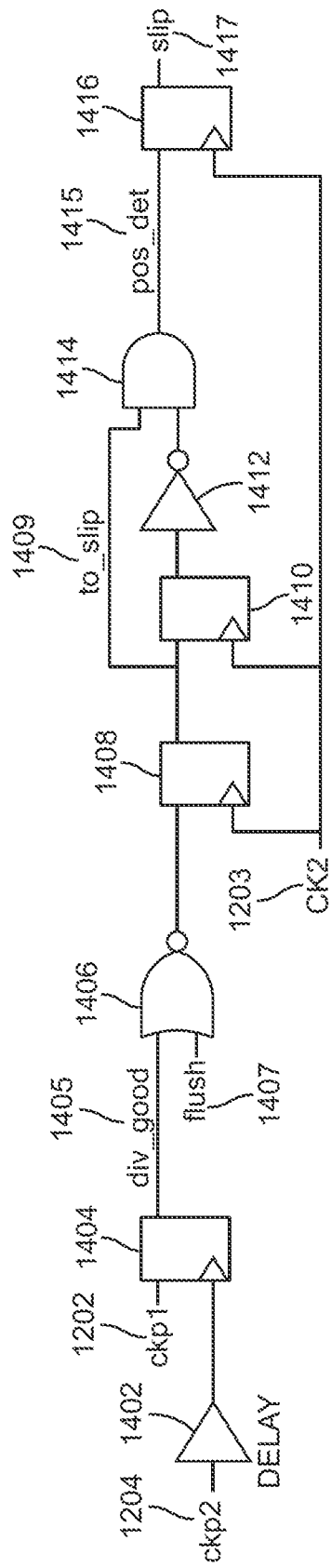
FIG. 14 is a first circuit diagram showing a frequency divider synchronizer, according to one or more embodiments.

Referring now to FIG. 14, a first circuit diagram 1400 of a frequency divider synchronizer is shown, according to an exemplary embodiment. The first circuit diagram 1400 is configured to determine whether one or more follower sub-rate clocks are synchronized to a master sub-rate clock. If the first circuit diagram 1400 determines that the sub-rate clocks are not synchronized, then the first circuit diagram 1400 may be configured to generate a slip signal which is configured to synchronize the follower sub-rate clocks to the master sub-rate clock. The first circuit diagram 1400 determines whether the one or more follower sub-rate clocks are synchronized based on a div_good signal 1405. Specifically, the first circuit diagram 1400 includes a buffer delay gate 1402 and may refer to a circuit element which is configured to provide a delay, if desired, between the timing of the master sub-rate clock (e.g., sub-rate clock 1202) and one or more follower sub-rate clocks (e.g., sub-rate clock 1204) in some embodiments. For example, as shown in FIG. 13B, the high frequency clock 1203 lags behind the high frequency clock 1201 for a certain time period. Therefore, for the sub-rate clocks to be properly synchronized, the sub-rate clock 1204 should lag behind the sub-rate clock 1202 by the same time period. In such a case, the buffer delay gate 1402 will ensure a proper lag between the sub-rate clocks. In some embodiments, the first circuit diagram 1400 may not include the buffer delay gate 1402 if the high-frequency clocks do not lag behind each other.

The delayed clock signal for the follower sub-rate clock (e.g., clock "ckp2" 1204) is used as an input to clock a flip flop 1404. The flip flop 1404 also includes an input of the master sub-rate clock which in this case is ckp1 (e.g., sub-rate clock 1202). The flip flop 1404 uses the follower sub-rate clock ckp2 (e.g., sub-rate clock 1204) to sample the master sub-rate clock ckp1. If the second sub-rate clock 1204 lags behind the first sub-rate clock 1202 correctly, the sampling by the flip flop 1404 yields an output of the div_good signal 1405 being high which indicates that the sub-rate clocks are synchronized. If the sub-rate clocks are out of synchronization, then the followers sub-rate clocks' rising edge will align with the master sub-rate clocks being low and the flip flop 1404 will yield the div_good signal 1405 being low which indicates that the clocks are not synchronized. In this way, the flip flop 1404 outputs a logical indication of whether the sub-rate clocks are synchronized.

The div_good signal 1405 is then used as an input to a NOR gate 1406 which is configured to invert the div_good signal 1405. For example, if the div_good signal 1405 is low, then it is inverted by the NOR gate 1406 to be high. Inversely, if the div_good signal 1405 is high, then it is inverted by the NOR gate to be low. The output of the NOR gate 1406 is fed into flip flop 1408. In some embodiments, the flip flop 1408 is clocked by the high frequency clock 1203. This may be done to ensure that the slip signal is only enabled for a desired number of periods of the high frequency clock 1203. If the div_good signal 1405 is low, which indicates that the sub-rate clocks are not synchronized, then the signal is inverted to produce a high signal. This high signal is fed into flip flop 1408 to synchronize it with the high frequency clock 1203 and produce a to_slip signal 1409 which is high. The to_slip signal 1409 may then be used as an input to AND gate 1414. Further, the high signal produced by the flip flop 1408 is fed into flip flop 1410 which is also clocked by the high frequency clock to produce a low signal. The low signal is used as an input for the inverter 1412 which produces a high signal which is used as a second input for the AND gate 1414. Given the high signals which are inputs to the AND gate 1414, the AND gate 1414 produces pos_det signal 1415 which is fed into the flip-flop 1416. The flip flop 1416 is configured to clock the pos_det signal 1415 to produce slip signal 1417 which is high. The slip signal 1417 may then be communicated to a control unit associated with the frequency divider which is configured to use the slip signal 1417 to synchronize the follower sub-rate clocks as described above with respect to FIGS. 13A-13C. If the div_good signal 1405 is high, then a slip signal 1417 is produced to be low following the logic described above.

Figure 15:
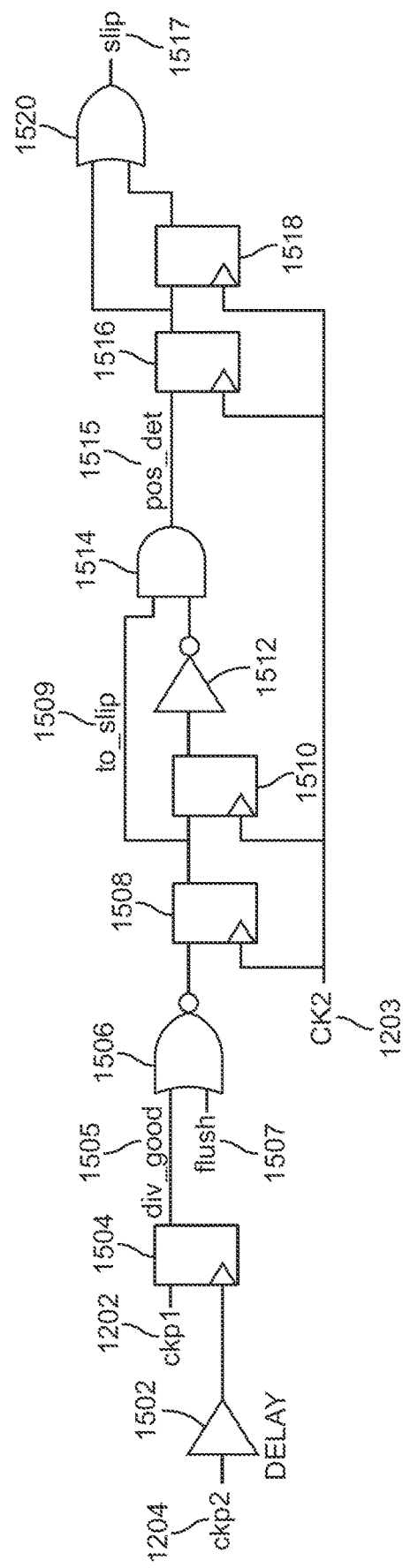
FIG. 15 is a second circuit diagram showing a frequency divider synchronizer, according to one or more embodiments.
Figure 16:
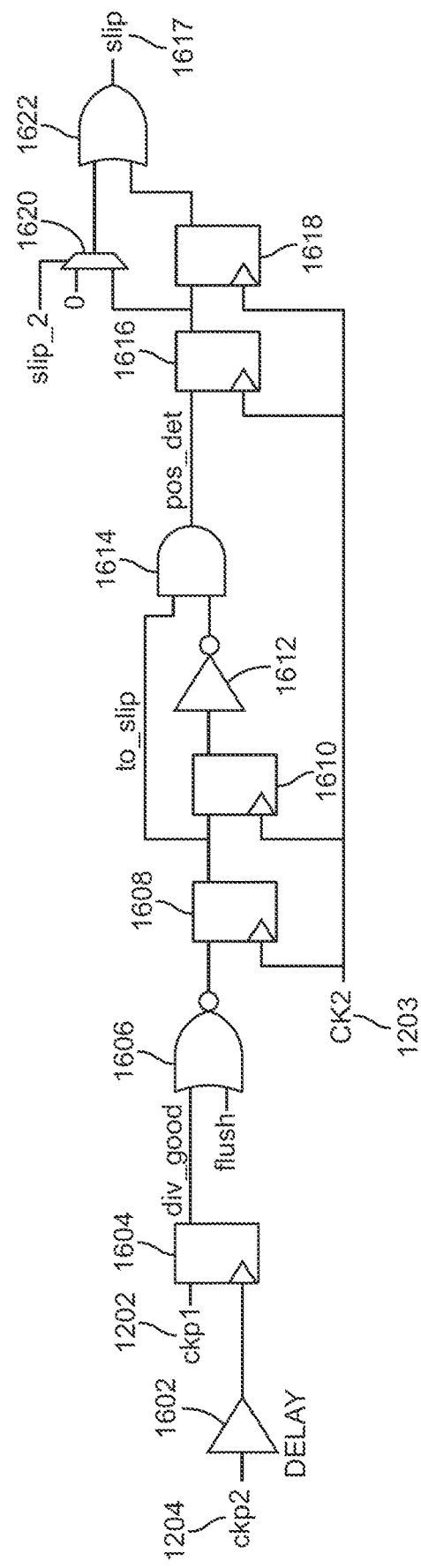
FIG. 16 is a third circuit diagram showing a frequency divider synchronizer, according to one or more embodiments.
Figure 17:
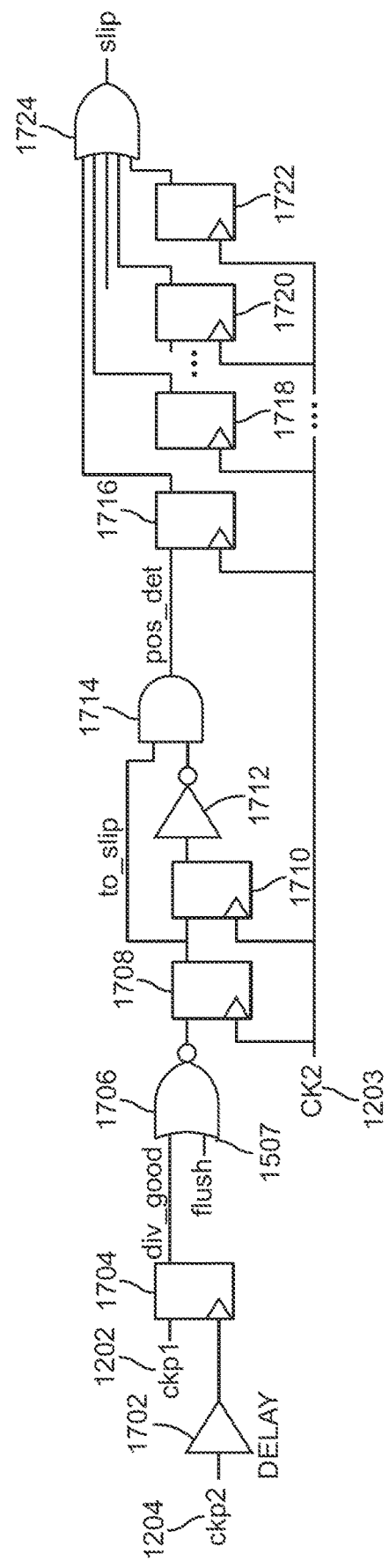
FIG. 17 is a fourth circuit diagram showing a frequency divider synchronizer, according to one or more embodiments.

Referring now to FIG. 15, a second circuit diagram 1500 showing an exemplary embodiment of a frequency divider synchronizer is shown, according to an exemplary embodiment. Similarly to the first circuit diagram 1400, the second circuit diagram 1500 is configured to determine whether one or more follower sub-rate clocks are synchronized to a master sub-rate clock. If the second circuit diagram 1500 determines that the sub-rate clocks are not synchronized, then the second circuit diagram 1500 may be configured to generate a slip signal which is configured to synchronize the follower sub-rate clocks to the master sub-rate clock. The second circuit diagram 1500 determines whether the one or more follower sub-rate clocks are synchronized based on a div_good signal 1505. The second circuit diagram 1500 includes many of the same elements described above with respect to first circuit diagram 1400. For example, the second circuit diagram 1500 includes a buffer delay gate 1502 which is similar to buffer delay gate 1402. The second circuit diagram 1500 also includes a flip flop 1504 which is configured to produce a div_good signal 1505 similarly to flip flop 1404. Further, the second circuit diagram 1500 includes a NOR gate 1507 with inputs div_good signal 1505 and flush signal 1507 similar to NOR gate 1406 with inputs div_good signal 1405 and flush signal 1507. The second circuit diagram 1500 also includes flip flops 1508 and 1510 which are similar to flip flops 1408 and 1410 described above. Flip flop 1508 produces to_slip signal 1509 similarly to how flip flop 1408 produces to_slip signal 1409 as described above. The second circuit diagram 1500 includes an inverter 1512 and an AND gate 1514 producing pos_det signal 1515 similarly to the inverter 1412, the AND gate 1414, and the pos_det signal 1415 respectively. Similar to pos_det signal 1415, pos_det signal 1515 is fed into one or more flip flops to produce a slip signal. The second circuit diagram 1500 differs from the first circuit diagram 1400 in that it includes more flip flops than included in the first circuit diagram 1400. The amount of flip flops used to create the slip signal directly correspond to the amount of periods the slip signal is active for. For example, the first circuit diagram 1400 includes only one flip flop 1416 which creates the slip signal 1417, which means that the slip signal is only active for one period of the clock 1203. In contrast, the second circuit diagram 1500 includes two flip flops 1516 and 1518, which feed into the OR gate 1520 to produce a slip signal 1517, which is active for two periods of the clock signal 1203.

In another exemplary embodiment, a circuit diagram may further include a multiplexer which is configured to provide an alternative method of determining the number of periods the slip signal is active. For example, referring now to FIG. 16, a third circuit diagram 1600 is shown, which is very similar to circuit diagram 1500 but includes a multiplexer 1620, which is used as an input to the OR gate 1622 to produce the slip signal 1617. Specifically, if the slip_2 signal 1624 is high, then the circuit diagram 1600 will produce a high slip signal for 2 periods of the clock signal 1203. However, if the slip_2 signal 1624 is low, then the circuit diagram 1600 will produce a high slip signal for 1 period of the clock signal 1203.

In another exemplary embodiment, the circuit diagram shown in FIG. 15 can be expanded to include more than two flip flops to create a slip signal which lasts for more than two periods of the clock signal 1203. For example, referring now to FIG. 17, a fourth circuit diagram 1700 is shown, according to an exemplary embodiment. The fourth circuit diagram 1700 includes most of the same components as circuit 1500 which are described in more detail above. Further, circuit diagram 1700 includes flip flops 1716, 1718, 1720, and 1722 which are configured to create a slip signal which lasts for more than two periods of the clock signal 1203. Specifically, the four flip flops signals included in FIG. 17 correspond to keeping a slip signal which is active for four clock periods of the clock signal 1203. An increase in the amount of flip flops would lead to the same increase in the amount of clock periods the slip signal is active for.

It should be noted that certain passages of this disclosure can reference terms such as "first" and "second" in connection with device signals, data, inputs, channels, etc., for purposes of identifying or differentiating one from another or from others. These terms are not intended to merely relate entities (e.g., a first input and a second input) temporally or according to a sequence, although in some cases, these entities can include such a relationship. Nor do these terms limit the number of possible entities (e.g., devices) that can operate within a system or environment.

It should be understood that the systems described above can provide multiple ones of any or each of those components. In addition, the systems and methods described above can be provided as one or more computer-readable programs or executable instructions, programmable circuits, or digital logic embodied on or in one or more articles of manufacture. The article of manufacture can be a floppy disk, a hard disk, a CD-ROM, a flash memory card, a PROM, a RAM, a ROM, ASIC or a magnetic tape. In general, the computer-readable programs can be implemented in any programming language, such as LISP, PERL, C, C++, C#, PROLOG, or in any byte code language such as JAVA. The software programs or executable instructions can be stored on or in one or more articles of manufacture as object code.

While the foregoing written description of the methods and systems enables one of ordinary skill to make and use various embodiments of these methods and systems, those of ordinary skill will understand and appreciate the existence of variations, combinations, and equivalents of the specific embodiment, method, and examples herein. The present methods and systems should therefore not be limited by the above described embodiments, methods, and examples, but by all embodiments and methods within the scope and spirit of the disclosure.

I claim:

1. A circuit comprising:
   a frequency divider configured to receive a plurality of first frequency input clock signals and provide a plurality of second frequency output clock signals, wherein the plurality of second frequency output clock signals are lower in frequency than the plurality of first frequency input clock signals;
   a phase detector configured to determine a difference between the plurality of second frequency output clock signals;
   a low pass filter configured to measure a clock signal spacing error associated with the plurality of second frequency output clock signals based on the difference between the plurality of second frequency output clock signals and to generate one or more control signals in response to the clock signal spacing error; and
   a control unit configured to generate one or more corrected first frequency input clock signals based on the one or more control signals, wherein the frequency divider is a quadrature divider.

2. The circuit of claim 1, wherein the quadrature divider comprises a flip flop configured to produce a single second frequency output clock signal of the plurality of second frequency output clock signals having half a frequency of a first frequency input clock signal of the plurality of first frequency input clock signals and one or more latches configured to produce four second frequency output clock signals of the plurality of second frequency output clock signals.

3. The circuit of claim 1, wherein the phase detector includes one or more logic gates configured to receive the plurality of second frequency output clock signals, wherein the plurality of second frequency output clock signals comprise at least a first signal of the plurality of second frequency output clock signals and a second signal of the plurality of second frequency output clock signals and wherein the phase detector compares the first signal to the second signal to detect the clock signal spacing error.

4. The circuit of claim 3, wherein the one or more logic gates are XOR gates.

5. The circuit of claim 1, wherein the low pass filter is configured to amplify the clock signal spacing error and determine the one or more control signals based on the amplified clock signal spacing error.

6. The circuit of claim 1, wherein the clock signal spacing error is a condition in which the timing of the rising edges of the plurality of second frequency output clock signals is not equal between each of the plurality of second frequency output clock signals.

7. A method comprising:
   receiving a plurality of first frequency input clock signals;
   providing a plurality of second frequency output clock signals, wherein the plurality of second frequency output clock signals are lower in frequency than the plurality of first frequency input clock signals, and wherein producing the plurality of second frequency output clock signals is done by a quadrature divider;
   determining a difference between the plurality of second frequency output clock signals to determine whether a clock signal spacing error is present;
   measuring the clock signal spacing error;
   determining one or more control signals based on the clock signal spacing error; and
   generating a corrected first frequency input clock signal based on the one or more control signals.

8. The method of claim 7, further comprising:
   receiving the plurality of second frequency output clock signals, wherein the plurality of second frequency output clock signals comprise at least a first signal of the plurality of second frequency output clock signals and a second signal of the plurality of second frequency output clock signals; and
   comparing the first signal to the second signal to detect the clock signal spacing error.

9. The method of claim 7, further comprising:
   amplifying the clock signal spacing error; and
   determining the one or more control signals based on the amplified clock signal spacing error.

10. The method of claim 7, wherein the clock signal spacing error is a condition where a time of a rising edge of a signal of the plurality of second frequency output clock signals is not equal to a time of a rising edge of another signal of the plurality of second frequency output clock signals.

11. The method of claim 7, wherein the quadrature divider comprises a flip flop configured to produce a second frequency output clock signal of the plurality of second frequency output clock signals having half the frequency of the plurality of first frequency input clock signals and one or more latches configured to produce four second frequency output clock signals of the plurality of second frequency output clock signals.

12. The method of claim 7, wherein the clock signal spacing error is a condition in which the timing of the rising edges of the plurality of second frequency output clock signals is not equal between each of the plurality of second frequency output clock signals.

13. A non-transitory computer readable medium storing instructions that when executed by one or more processors cause the one or more processors to:
   receive a plurality of first frequency input clock signals;
   provide a plurality of second frequency output clock signals, wherein the plurality of second frequency output clock signals are lower in frequency than the plurality of first frequency input clock signals, wherein producing the plurality of second frequency output clock signals is done by a quadrature divider;
   determine a difference between the plurality of second frequency output clock signals to determine whether a clock signal spacing error is present;
   measure the clock signal spacing error;
   determine one or more control signals based on the clock signal spacing error; and
   generate one or more corrected first frequency input clock signals based on the one or more control signals.

14. The non-transitory computer readable medium of claim 13, further causing the one or more processors to:
   receive the plurality of second frequency output clock signals, wherein the plurality of second frequency output clock signals comprise at least a first signal of the plurality of second frequency output clock signals and a second signal of the plurality of second frequency output clock signals; and
   compare the first signal to the second signal to detect the clock signal spacing error.

15. The non-transitory computer readable medium of claim 13, further causing the one or more processors to:
   amplify the clock signal spacing error; and
   determine the one or more control signals based on the amplified clock signal spacing error.

16. The non-transitory computer readable medium of claim 13, wherein the clock signal spacing error is a condition in which a timing of a rising edge of a signal of the plurality of second frequency output clock signals is not equal to a timing of a rising edge of another signal of the plurality of second frequency output clock signals.

17. The non-transitory computer readable medium of claim 13, wherein the quadrature divider comprises a flip flop configured to produce a second frequency output clock signal of the plurality of second frequency output clock signals having half a frequency of a first frequency input clock signal of the plurality of first frequency input clock signals and one or more latches configured to produce four second frequency output clock signals of the plurality of second frequency output clock signals.

* * * * *